US 6,677,209 B2

(12) United States Patent
Farrar

(10) Patent No.: US 6,677,209 B2
(45) Date of Patent: Jan. 13, 2004

(54) LOW DIELECTRIC CONSTANT STI WITH SOI DEVICES

(75) Inventor: Paul A. Farrar, Okatie, SC (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/099,169

(22) Filed: Mar. 13, 2002

(65) Prior Publication Data

US 2002/0094651 A1 Jul. 18, 2002

Related U.S. Application Data

(63) Continuation-in-part of application No. 09/503,278, filed on Feb. 14, 2000, now Pat. No. 6,413,827.

(51) Int. Cl.[7] .............................................. H01L 21/336
(52) U.S. Cl. ....................... 438/296; 438/294; 438/421
(58) Field of Search ............................... 438/296, 411, 438/412, 421, 294

(56) References Cited

U.S. PATENT DOCUMENTS

| 3,506,438 A | 4/1970 | Krock et al. ............... 75/208 |
|---|---|---|
| 3,953,566 A | 4/1976 | Gore ........................ 264/288 |
| 3,956,195 A | 5/1976 | Topchiashvili et al. ...... 252/511 |
| 3,962,153 A | 6/1976 | Gore ........................ 260/2.5 R |
| 4,096,227 A | 6/1978 | Gore ........................ 264/210 R |
| 4,368,350 A | 1/1983 | Perelman ................... 174/102 |
| 4,482,516 A | 11/1984 | Bowman et al. ............. 264/127 |
| 4,561,173 A | 12/1985 | Te Velde .................... 438/619 |
| 4,599,136 A * | 7/1986 | Araps et al. ................ 438/424 |
| 4,725,562 A | 2/1988 | El-Kareh et al. ............ 437/67 |
| 4,749,621 A | 6/1988 | Araps et al. ............... 428/473.5 |
| 4,962,058 A | 10/1990 | Cronin et al. .............. 437/187 |
| 5,103,288 A | 4/1992 | Sakamoto et al. ........... 357/71 |
| 5,137,780 A | 8/1992 | Nichols et al. ............. 428/336 |
| 5,158,986 A | 10/1992 | Cha et al. .................. 521/82 |
| 5,158,989 A | 10/1992 | Ogitani et al. .............. 522/77 |
| 5,171,713 A | 12/1992 | Matthews ................... 437/189 |
| 5,173,442 A | 12/1992 | Carey ........................ 437/173 |

(List continued on next page.)

FOREIGN PATENT DOCUMENTS

| EP | 578856 A1 | 7/1992 | ........ H01L/21/334 |
|---|---|---|---|
| GB | 2158995 A | 11/1985 | ........ H01Q/17/00 |
| JP | 01-230505 | 8/2001 | ........ H05K/1/03 |

OTHER PUBLICATIONS

Bai, Y., et al., "Photosensitive Polynorbornene as a Dielectric Material for Packaging Applications", *Proceedings of the 2001 International Symposium on Advanced Packaging Materials*, (2001),322–326.

Grove, N., et al., "Functionalized Polynorbornene Dielectric Polymers: Adhesion and Mechanical Properties", *Journal of Polymer Science*, (1999),3003–3010.

Labadie, J., et al., "Nanopore Foams of High Temperature Polymers", *IEEE Transactions on Components, Hybrids, and Manufacturing Technology, 15*, (Dec., 1992),925–930.

(List continued on next page.)

Primary Examiner—Richard Elms
Assistant Examiner—Beth E. Owens
(74) Attorney, Agent, or Firm—Schwegman, Lundberg, Woessner & Kluth, P.A.

(57) ABSTRACT

Techniques of shallow trench isolation and devices produced therefrom are shown. The techniques of shallow trench isolation utilize foamed polymers, cured aerogels or air gaps as the insulation medium. Such techniques facilitate lower dielectric constants than the standard silicon dioxide due to the cells of gaseous components inherent in foamed polymers, cured aerogels or air gaps. Lower dielectric constants reduce capacitive coupling concerns and thus permit higher device density in an integrated circuit device. The shallow trench isolation structures are used on a variety of substrates including silicon-on-insulator (SOI) substrates and silicon-on-nothing (SON) substrates.

36 Claims, 14 Drawing Sheets

U.S. PATENT DOCUMENTS

| | | | |
|---|---|---|---|
| 5,227,103 A | 7/1993 | Muschiatti | 264/45.9 |
| 5,324,683 A | 6/1994 | Fitch et al. | 437/65 |
| 5,334,356 A | 8/1994 | Baldwin et al. | 422/133 |
| 5,340,843 A | 8/1994 | Tsuruta et al. | 521/79 |
| 5,408,742 A | 4/1995 | Zaidel et al. | 29/846 |
| 5,449,427 A | 9/1995 | Wojnarowski et al. | 156/155 |
| 5,470,693 A | 11/1995 | Sachdev et al. | 430/315 |
| 5,470,802 A | 11/1995 | Gnade et al. | 437/238 |
| 5,473,814 A | 12/1995 | White | 29/840 |
| 5,486,493 A | 1/1996 | Jeng | 437/195 |
| 5,510,645 A | 4/1996 | Fitch et al. | 257/522 |
| 5,548,159 A | 8/1996 | Jeng | 257/634 |
| 5,552,638 A | 9/1996 | O'Connor et al. | 257/759 |
| 5,554,305 A | 9/1996 | Wojnarowski et al. | 216/62 |
| 5,554,870 A | 9/1996 | Fitch et al. | 257/334 |
| 5,591,676 A | 1/1997 | Hughes et al. | 437/195 |
| 5,593,926 A | 1/1997 | Fujihira | 437/209 |
| 5,747,880 A | 5/1998 | Havemann et al. | 257/759 |
| 5,780,121 A | 7/1998 | Endo | 427/569 |
| 5,785,787 A | 7/1998 | Wojnarowski et al. | 156/155 |
| 5,786,630 A | 7/1998 | Bhansali et al. | 257/697 |
| 5,798,200 A | 8/1998 | Matsuura et al. | 430/126 |
| 5,804,607 A | 9/1998 | Hedrick et al. | 521/64 |
| 5,821,621 A | 10/1998 | Jeng | 257/759 |
| 5,830,923 A | 11/1998 | Venkataraman | 521/64 |
| 5,841,075 A | 11/1998 | Hanson | 174/250 |
| 5,844,317 A | 12/1998 | Bertolet et al. | 257/773 |
| 5,864,923 A | 2/1999 | Rouanet et al. | 23/295 R |
| 5,878,314 A | 3/1999 | Takaya et al. | 399/302 |
| 5,879,787 A | 3/1999 | Petefish | 428/209 |
| 5,879,794 A | 3/1999 | Korleski | 428/317.1 |
| 5,891,797 A | 4/1999 | Farrar | 438/617 |
| 5,912,313 A | 6/1999 | McIntosh et al. | 526/279 |
| 5,923,074 A | 7/1999 | Jeng | 257/522 |
| 5,926,732 A | 7/1999 | Matsuura | 438/622 |
| 5,953,626 A | 9/1999 | Hause et al. | 438/622 |
| 6,037,245 A | 3/2000 | Matsuda | 438/586 |
| 6,037,249 A | 3/2000 | Chiang et al. | 438/619 |
| 6,040,628 A | 3/2000 | Chiang et al. | 257/760 |
| 6,043,146 A | 3/2000 | Watanabe et al. | 438/623 |
| 6,071,600 A | 6/2000 | Rosenmayer | 428/213 |
| 6,077,792 A | 6/2000 | Farrar | 438/760 |
| 6,165,890 A | 12/2000 | Kohl et al. | 438/619 |
| 6,172,305 B1 | 1/2001 | Tanahashi | 174/255 |
| 6,195,156 B1 | 2/2001 | Miyammoto et al. | 355/85 |
| 6,245,658 B1 | 6/2001 | Buynoski | 438/619 |
| 6,255,712 B1 | 7/2001 | Clevenger et al. | 257/522 |
| 6,265,303 B1 | 7/2001 | Lu et al. | 438/623 |
| 6,268,637 B1 | 7/2001 | Gardner et al. | 257/522 |
| 6,287,979 B1 | 9/2001 | Zhou et al. | 438/723 |
| 6,313,046 B1 | 11/2001 | Juengling et al. | 438/781 |
| 6,313,518 B1 | 11/2001 | Ahn et al. | 257/632 |
| 6,323,125 B1 | 11/2001 | Soo et al. | 438/645 |
| 6,331,480 B1 | 12/2001 | Tsai et al. | 438/624 |
| 6,333,556 B1 | 12/2001 | Juengling et al. | 257/537 |
| 6,342,454 B1 | 1/2002 | Hawker et al. | 438/780 |
| 6,350,672 B1 | 2/2002 | Sun | 438/619 |
| 6,352,818 B1 | 3/2002 | Hsieh | 430/322 |
| 6,380,294 B1 | 4/2002 | Babinec et al. | 524/440 |
| 6,413,827 B2 | 7/2002 | Farrar | 438/296 |
| 6,420,261 B2 | 7/2002 | Kudo | 438/633 |
| 6,420,262 B1 | 7/2002 | Farrar | 438/652 |
| 6,420,441 B1 | 7/2002 | Allen et al. | 521/77 |
| 6,503,818 B1 | 1/2003 | Jang | 438/584 |
| 2001/0005625 A1 | 6/2001 | Sun | 438/634 |
| 2001/0014512 A1 | 8/2001 | Lyons et al. | 438/424 |
| 2001/0014526 A1 | 8/2001 | Clevenger et al. | 438/619 |
| 2001/0019876 A1 | 9/2001 | Juengling et al. | 438/456 |
| 2001/0034117 A1 | 10/2001 | Eldridge et al. | 438/619 |
| 2001/0050438 A1 | 12/2001 | Juengling et al. | 257/758 |
| 2002/0019125 A1 | 2/2002 | Juengling et al. | 438/631 |
| 2002/0037603 A1 | 3/2002 | Eldridge et al. | 438/112 |
| 2002/0094651 A1 | 7/2002 | Farrar | 438/296 |

OTHER PUBLICATIONS

"Properties and Selection: Nonferrous Alloys and Pure Metals", *Metals Handbook Ninth Edition, vol. 2*, ASM International, (1979), pp. 796–797.

"ACCUSPIN T–18 Flowable Spin–On Polymer (SOP)", *AlliedSignal—Advanced Microelectronic Materials*, Sunnyvale, CA, (Jul., 1998), 2 pages.

"Packaging", *Electronic Materials Handbook, vol. 1*, ASM International, (1989), pp. 105, 768–769.

"Properties and Selection: Nonferrous Alloys and Pure Metals", *Metals Handbook Ninth Edition, vol. 2*, ASM International, (1979), pp. 157, 395.

Chiniwalla, P., et al., "Structure–Property Relations for Polynorbornenes", *Proceedings from the Eigth Meeting of the Dupont Symposium on Polymides In Microelectronics*, (1998), pp. 615–642.

Conti, R., et al., "Processing Methods to Fill High Aspect Ratio Gaps Without Premature Constriction", *1999 Proceedings of Dielectrics for Multilevel Interconnection Conference*, (1999), pp. 201–209.

Craig, J.D., "Polymide Coatings", *Packaging, Electronic Materials Handbook, vol. 1*, ASM International Handbook Committee (eds.), ASM International, Materials Park, OH, (1989), pp. 767–772.

Jayaraj, K., et al., "Low Dielectric Constant Microcellular Foams", *Proceedings from the Seventh Meeting of the DuPont Symposium on Polymides in Microelectrics*, (Sep., 1996), pp. 474–501.

Jin, C., et al., "Porous Xerogel Films as Ultra–Low Permittivity Dielectrics for ULSI Interconnect Applications", *Conference Proceedings ULSI XII—1997 Materials Research Society*, (1997), pp. 463–469.

Miller, R.D., et al., "Low Dielectric Constant Polyimides and Polyimide Nanofoams", *Seventh Meeting of the DuPont Symposium on Polymides in Microelectronics*, (Sep., 1996), pp. 443–473.

Ramos, T., et al., "Nanoporous Silica for Dielectric Constant Less Than 2", *Conference Proceedings ULSI XII—1997 Materials Research Society*, (1997), pp. 455–461.

Remenar, J., et al., "Templating Nanopores into Poly (Methylsilsesquioxane): New–Low Dielectric Coatings Suitable for Microelectronic Applications", *Materials Research Society Symposium Proceedings, 511*, (1998), pp. 69–74.

Shibasaki, T., et al., "Process and Application of Fumed Silica AEROSIL", *3rd Annual Workshop on Mechanical Polishing*, Lake Placid, New York, (1998), pp. 1–26.

Singer, P., "The New Low–k Candidate: It's a Gas", *Semiconductor International*, 22(3), (Mar., 1999), p. 38.

Ting, C.H., "Low K Material/Process Development", *1996 VLSI Multilevel Interconnection State–of–the–Art Seminar*, (Jun., 1996), pp. 171–212.

Van Vlack, L.H., *Elements of Materials Science*, Addison–Wesley Publishing Co., Inc., Reading, MA, (1959), p. 468.

Vardaman, E.J., "Future Packaging Trends: CSP vs. Flip Chip", *11th European Microelectrics Conference*, (1997), pp. 295–299.

Volksen, W., et al., "Characterization and Processing Considerations for Methylsilsesquioxane Based Dialectricts", *Proceedings of the Fifth Dialectric for ULSI Multilevel Interconnections*, Santa Clara, CA, (1999), pp. 83–90.

* cited by examiner

LOW DIELECTRIC CONSTANT STI WITH SOI DEVICES

This application is a Continuation-in-Part of U.S. patent application Ser. No. 09/503,278 filed on Feb. 14, 2000, now U.S. Pat. No. 6,413.827 issued Jul. 2, 2002.

TECHNICAL FIELD

The present invention relates generally to isolation techniques in integrated circuits, and in particular to shallow trench isolation techniques having materials of low dielectric constant for use in the development and fabrication of integrated circuits.

BACKGROUND

Implementing electronic circuits involves connecting isolated devices through specific electronic paths. In integrated circuit fabrication it is generally necessary to isolate adjacent devices from one another. They are subsequently interconnected to create the desired circuit configuration. In the continuing trend toward higher device densities, parasitic interdevice currents become more problematic, thus isolation technology has become a critical aspect of contemporary integrated circuit fabrication.

A variety of successful isolation technologies have been developed to address the requirements of different integrated circuit types such as NMOS, CMOS and bipolar. In general, the various isolation technologies exhibit different attributes with respect to such characteristics as minimum isolation spacing, surface planarity, process complexity and defect density generated during isolation processing. Moreover, it is common to trade off some of these characteristics when developing an isolation process for a particular integrated circuit application.

In metal-oxide-semiconductor (MOS) technology it is necessary to provide an isolation structure that prevents parasitic channel formation between adjacent devices, such devices being primarily NMOS or PMOS transistors or CMOS circuits. A widely used isolation technology for MOS circuits has been that of LOCOS isolation, an acronym for LOCal Oxidation of Silicon. LOCOS isolation essentially involves the growth of a recessed or semi-recessed oxide in unmasked non-active or field regions of the silicon substrate. This so-called field oxide is generally grown thick enough to lower any parasitic capacitance occurring over these regions, but not so thick as to cause step coverage problems. The great success of LOCOS isolation technology is to a large extent attributed to its inherent simplicity in MOS process integration, cost effectiveness and adaptability.

In spite of its success, several limitations of LOCOS technology have driven the development of alternative isolation structures. A well-known limitation in LOCOS isolation is that of oxide undergrowth at the edge of the mask which defines the active regions of the substrate. This so-called bird's beak (as it appears) poses a limitation to device density, since that portion of the oxide adversely influences device performance while not significantly contributing to device isolation. Another problem associated with the LOCOS process is the resulting circuit planarity or lack thereof. For submicron devices, planarity becomes an important issue, often posing problems with subsequent layer conformality and photolithography.

Trench isolation technology has been developed in part to overcome the aforementioned limitations of LOCOS isolation for submicron devices. Refilled trench structures essentially comprise a recess formed in the silicon substrate which is refilled with a dielectric material. Such structures are fabricated by first forming micron-sized or submicron-sized trenches in the silicon substrate, usually by a dry anisotropic etching process. The resulting trenches typically display a steep sidewall profile as compared to LOCOS oxidation. The trenches are subsequently refilled with a dielectric such as chemical vapor deposited (CVD) silicon dioxide ($SiO_2$). They are then planarized by an etchback process so that the dielectric remains only in the trench, its top surface level with that of the silicon substrate. The etchback process is often performed by etching photoresist and the deposited silicon dioxide at the same rate. The top surface of the resist layer is highly planarized prior to etchback through application of two layers of resist, and flowing the first of these layers. Active regions wherein devices are fabricated are those that were protected from etch when the trenches were created. The resulting structure functions as a device isolator having excellent planarity and potentially high aspect ratio beneficial for device isolation. Refilled trench isolation can take a variety of forms depending upon the specific application; they are generally categorized in terms of the trench dimensions: shallow trenches (<1 $\mu$m), moderate depth trenches (1–3 $\mu$m), and deep, narrow trenches (>3 $\mu$m deep, <2 $\mu$m wide). Shallow Trench Isolation (STI) is used primarily for isolating devices of the same type and is often considered an alternative to LOCOS isolation. Shallow trench isolation has the advantages of eliminating the birds beak of LOCOS and providing a high degree of surface planarity.

As the minimum feature size achievable in semiconductor manufacturing decreases, the capacitive coupling between adjacent devices becomes a significant impediment to achieving higher performance. To counteract such increasing capacitive coupling, designers and engineers have been looking for ways to reduce the capacitive load. Some designers have used polyimides in place of the $SiO_2$ with limited improvement of STI. However, $SiO_2$ remains the most widely-used filler material for such trenches.

In addition to the above described need to improve isolation between adjacent devices, there is also a need to improve the isolation structure beneath devices.

For the reasons stated above, and for other reasons stated below which will become apparent to those skilled in the art upon reading and understanding the present specification, there is a need in the art for alternative insulating materials and methods of their use in an integrated circuit.

SUMMARY OF THE INVENTION

Embodiments of the invention include apparatus utilizing cells of gaseous components in trench isolation of active regions in a substrate, as well as methods of forming such apparatus. The substrate may include a semiconductor layer over a dielectric layer. The cells of gaseous components may be formed as in a foamed polymeric material, a cured aerogel or an air gap. The cells provide lower dielectric constants than many widely-used trench filler materials, such as $SiO_2$, and thus improved values of capacitive coupling. In the case of foamed polymeric materials or cured aerogels, the matrix provides mechanical support while approaching the dielectric constant of free space.

For one embodiment, the invention provides an integrated circuit device. The integrated circuit device includes a first active region formed in a substrate, a second active region formed in the substrate, and a trench formed in the substrate and interposed between the first active region and the second active region. The trench contains cells of gaseous components.

For another embodiment, the invention provides an integrated circuit device. The integrated circuit device includes a first active region formed in a substrate, a second active region formed in the substrate, and a trench formed in the substrate and interposed between the first active region and the second active region. The trench is filled with a foamed polymeric material.

For yet another embodiment, the invention provides an integrated circuit device. The integrated circuit device includes a first active region formed in a substrate, a second active region formed in the substrate, and a trench formed in the substrate and interposed between the first active region and the second active region. The trench is filled with a cured aerogel.

For a further embodiment, the invention provides an integrated circuit device. The integrated circuit device includes a first active region formed in a substrate, a second active region formed in the substrate, and a trench formed in the substrate and interposed between the first active region and the second active region. The trench is filled with an air gap.

For one embodiment, the invention provides a method of isolating a first active region from a second active region in an integrated circuit device. The method includes forming a substrate by forming a dielectric layer, and coupling a semiconductor layer to the dielectric layer. The method further includes forming a trench in the substrate, wherein the first active region is on a first side of the trench and the second active region is on a second side of the trench. The method further includes filling the trench with a polymeric material and foaming the polymeric material.

For another embodiment, the invention provides a method of isolating a first active region from a second active region in an integrated circuit device. The method includes forming a substrate by forming a dielectric layer, and coupling a semiconductor layer to the dielectric layer. The method further includes forming a trench in the substrate, wherein the first active region is on a first side of the trench and the second active region is on a second side of the trench. The method further includes filling the trench with an aerogel material and curing the aerogel material.

For yet another embodiment, the invention provides a method of isolating a first active region from a second active region in an integrated circuit device. The method includes forming a substrate by forming a dielectric layer, and coupling a semiconductor layer to the dielectric layer. The method further includes forming a trench in the substrate, wherein the first active region is on a first side of the trench and the second active region is on a second side of the trench. The method further includes filling the trench with a polymeric material, defining additional structures in the integrated circuit device, and removing the polymeric material.

For a further embodiment, the invention provides a method of isolating a first active region from a second active region in an integrated circuit device. The method includes forming a substrate by forming a dielectric layer, and coupling a semiconductor layer to the dielectric layer. The method further includes forming a trench in the substrate, wherein the first active region is on a first side of the trench and the second active region is on a second side of the trench. The method further includes filling the trench with a first fill material and defining additional structures in the integrated circuit device. The method still further includes removing the first fill material and filling the trench with a second fill material.

Further embodiments of the invention include integrated circuit devices and methods of varying scope, as well as apparatus, devices, modules and systems making use of such integrated circuit devices and methods.

DETAILED DESCRIPTION OF THE EMBODIMENTS

Figure 1A:
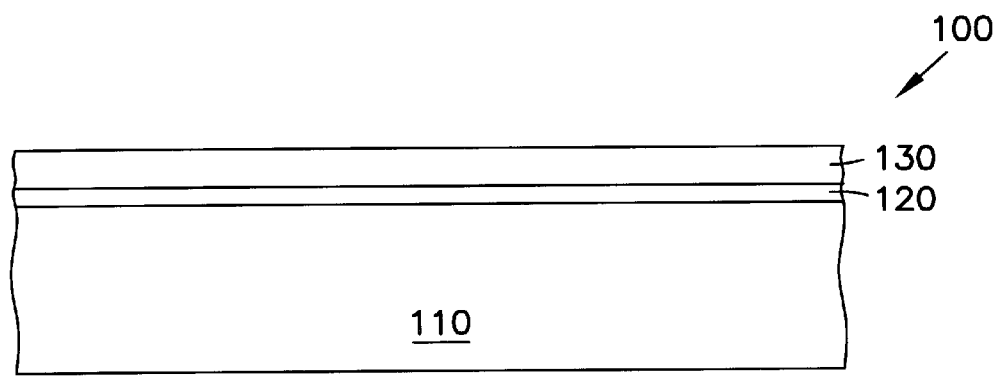
FIGS. 1A–1H are cross-sectional views of an integrated circuit device at various processing stages in accordance with one embodiment of the invention.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, silicon-on-nothing (SON) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

In accordance with some embodiments of the invention, foamed polymeric material is utilized as an insulating material within an integrated circuit (IC). Polymeric materials are meant to include organic polymers (i.e., materials containing 5 or more mer units having carbon chain backbones), organic oligomers (i.e., materials containing 2 to 4 mer units having carbon chain backbones), organic monomers (i.e., materials containing one mer unit having a carbon chain backbone), and materials having properties similar to those of organic polymers. For example, organic polymers are often characterized by having at least one of the following properties: high ductility; a low elastic modulus (also referred to as Young's Modulus (E)); or a low compressive yield strength. In comparison, polymeric materials, as referred to herein, do not include brittle materials, such as ceramics, that are often characterized by their high compressive yield strength. Furthermore, polymeric materials will exhibit a tendency to flow more readily, making their application much easier than, for example, ceramic materials. Any of the above polymeric materials capable of being foamed, however, is suitable for use in accordance with the present invention.

The use of foamed polymeric material advantageously provides a lower dielectric constant insulating material within an integrated circuit relative to conventional silicon dioxide ($SiO_2$). Foamed polymeric material combines the minimal dielectric constant of air, $1.0\in_0$, with the mechanical strength of the polymeric material. The polymeric material behaves as a matrix for porous structures containing air. The lower dielectric constant of such foamed polymeric material allows its advantageous use in integrated circuits where capacitive coupling has typically been problematic. Foamed polymeric material provides relief for capacitive coupling problems.

Foamed polymeric material has many advantages. For example, unlike conventional $SiO_2$, which has a dielectric constant of about $4.0\in_0$, the polymeric matrix materials utilized in the porous insulating material of the present invention can have lower dielectric constants relative to that of $SiO_2$.

For one embodiment, the polymeric material utilized is able to withstand high subsequent processing temperatures in order to maximize the situations in which it can be utilized in an integrated circuit. Such polymeric materials include polyimides due to their relative stability at higher temperatures. Some polyimides are able to withstand exposure to temperatures as high as 232° C. for extended periods of time. Other polyimides are able to withstand exposure to temperatures as high as 316° C. for extended periods of time. Type III polyimides have a decomposition temperature of 580° C. and a glass transition temperature above 320° C. Type I and Type V polyimides, have decomposition temperatures of 580° C. and 620° C., respectively. These materials both have glass transition temperatures above 400° C. Such characteristics are found in "The Electronic Materials Handbook—Volume I Packaging," ASM International, Metals Park, Ohio (1989). Polyimides may also be able to withstand exposure to higher temperatures for shorter durations. Both Type I and Type V polyimides can be exposed to temperatures up to 450° C. for about one to two hours without significant weight loss, although some out gassing may occur between 430° C. and 450° C.

There are a wide variety of suitable polyimides available. Polyimides are usually prepared by reacting a dianhydride and an aromatic diamine. The resulting polyimide is classified according to the type of dianhydride used. For example, Type I, Type III, and Type V polyimides are readily available and suitable for use in accordance with the present invention. Type I polyimide is prepared from pyromellitic dianhydride (PMDA) and oxydianiline (ODA). Type III polyimide is prepared from 4-4'-benzophenone dicarboxylic dianhydride (BTDA). Type V polyimide is prepared from biphenyl dianhydride (BPDA).

Type I polyimide has an elastic modulus of about 1.4 GPa and a coefficient of thermal expansion of about 20 $\mu$m/m° C. Type III polyimide has an elastic modulus of about 2.4 GPa and a coefficient of thermal expansion of about 40 $\mu$m/m° C. Type V polyimide has an elastic modulus of about 8.3 GPa and a coefficient of thermal expansion of about 40 $\mu$m/m° C. When such polymeric material is foamed, the elastic modulus should be reduced, while the coefficient of thermal expansion should remain about the same as that of the unfoamed polymeric material.

Other suitable polymeric materials include, for example, parylene, polynorbornenes and fluorinated polymers. Parylene-N has a melting point of 420° C., a tensile modulus of 2.4 GPa, and a yield strength of 42 MPa. Parylene is based on p-xylyene and is prepared by vapor-phase polymerization. One class of polynorbornene includes Avatrel™ polymer available from BF Goodrich, Cleveland, Ohio, USA. Silane may be added to polynorbornenes to further lower the dielectric constant.

The use of fluorinated polymers, preferably fluorinated polyimides, and more preferably fluorinated Type I polyimides have certain advantages. It is well known that the fluorine containing polymers have lower dielectric constants than similar polymers without fluorine additions. An additional advantage of the fluorine containing polymers is based on such polymers tending to be hydrophobic by nature. Such a tendency insures that even if water diffuses through the foamed polymer it will not condense in the voids so as to increase the dielectric constant of the foamed material.

In addition to polymeric matrix materials, aerogels, such as silica aerogel, may be utilized to provide porous insulating material of the various embodiments. Aerogels are generally a gel material that forms a porous matrix when liquid or solvent in the gel is replaced by air or another gaseous component. Aerogels generally experience only minimal volumetric change upon such curing.

FIGS. 1A–1H depict cross-sectional views of a portion of an integrated circuit device 100 at various processing stages in accordance with one embodiment of the invention. The general processing described herein can be adapted to a variety of integrated circuit devices. As one example, additional processing steps well understood by those skilled in the art may be utilized to define field-effect transistors (FETs) for such integrated circuit devices as a memory device.

In FIG. 1A, a gate oxide layer 120 is formed as a first layer overlying a substrate 110. A polysilicon layer 130 is formed as a second layer overlying the substrate 110 and the gate oxide layer 120.

Figure 1B:
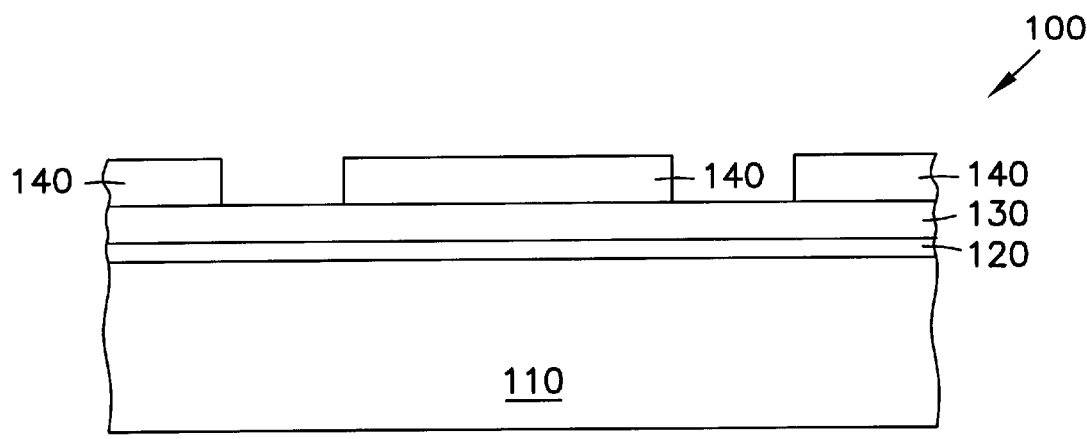
Figure 1C:
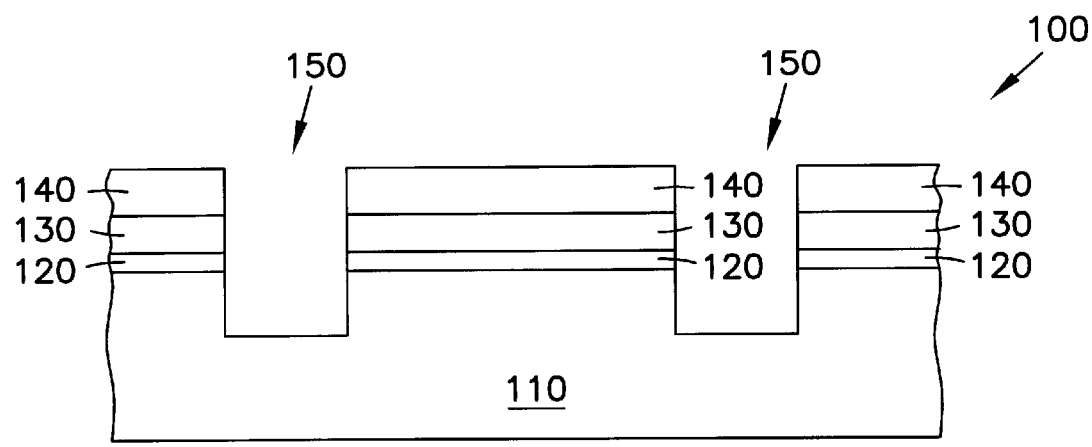
Figure 1D:
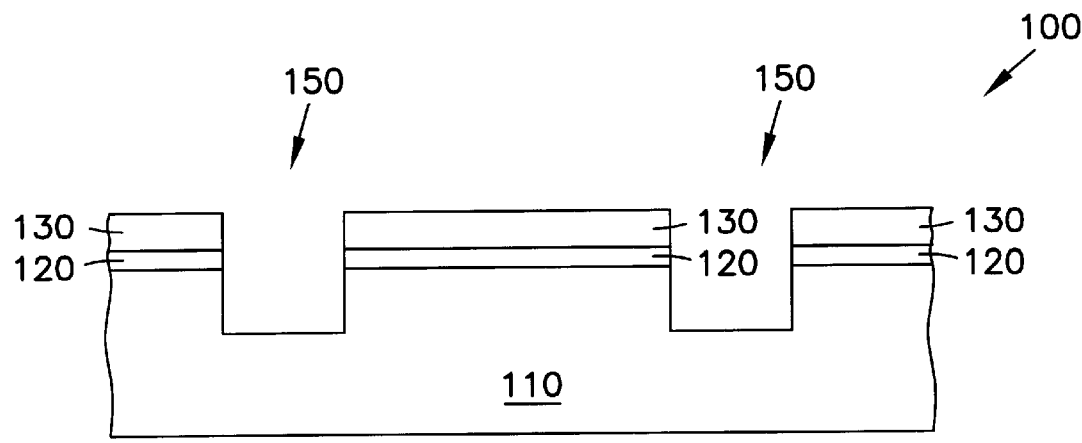

In FIG. 1B, a mask layer 140 is formed overlying the polysilicon layer 130 and patterned to expose areas defining future trenches. In FIG. 1C, a portion of the polysilicon layer 130, the gate oxide layer 120 and the substrate 110 are removed to form trenches 150 having a bottom defined by the substrate 110 and sidewalls defined by the substrate 110, gate oxide layer 120 and polysilicon layer 130. In FIG. 1D, the mask layer 140 is removed.

Figure 1E:
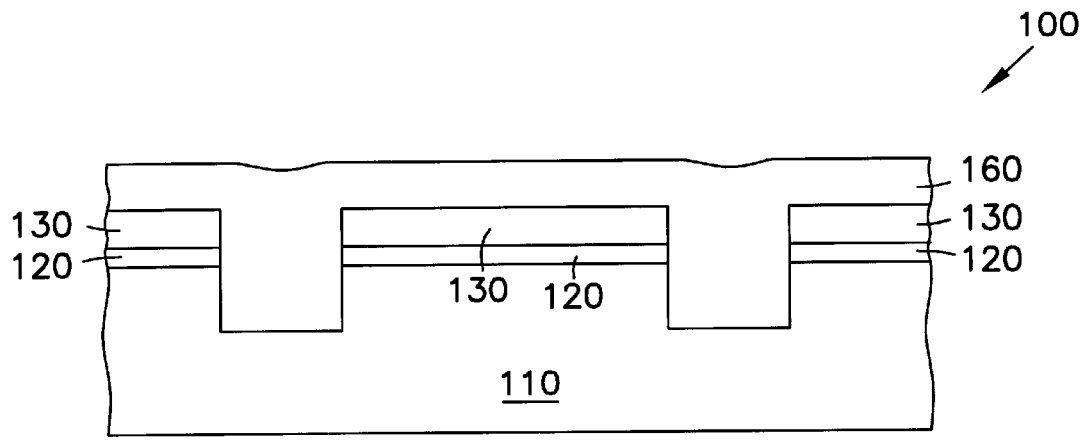

In FIG. 1E, a fill layer 160 is formed overlying the polysilicon layer 130 and filling the trenches 150. For one embodiment, fill layer 160 contains a polymer as defined herein. For another embodiment, fill layer 160 contains a silica aerogel. For a further embodiment, fill layer 160 contains a methylsilsesquioxane (MSSQ) material. A wide variety of methods are available for applying the fill layer 160 to the substrate 112. For example, spin-on coating, spraying, and dipping maybe utilized to apply polymers or aerogels to the substrate 110. Furthermore, a combination of such application techniques or any other techniques known to one skilled in the art may be used.

For embodiments utilizing a polymeric material for fill layer 160, the polymeric material is generally cured, or crosslinked, following formation. For one embodiment, curing can include an optional low temperature bake to drive off most of the solvents that may be present in the polymer prior to crosslinking. In the case of an organic polymer, curing may further include baking in a furnace (e.g., about a 350° C. to about a 500° C. furnace) or heating on a hot plate. Other conventional polymers can be cured by exposing them to visible or ultraviolet light. Still other conventional polymers can be cured by adding curing (e.g., crosslinking) agents to the polymer. It is preferred, when using Type I polymers, to use a multiple step cure to achieve maximum effectiveness. For example, such a multiple step cure may include processing in the range of about 100° C. to about 125° C. for about 10 minutes, about 250° C. for about 10 minutes, followed by about 375° C. for about 20 minutes. It should be readily apparent to one skilled in the art that the times and temperatures may vary depending upon various factors, including the desired properties of the materials used, and that the present invention is in no manner limited to the illustrative multiple step cure presented above. Various multiple step curing methods may be suitable. For one embodiment, hot plate curing is used. For one embodiment utilizing MSSQ for fill layer 160, a low temperature bake may include processing in the range of about 180° C. for about 2 minutes followed by about 250° C. for about 1 minute, while a multiple step cure may include processing in the range of about 275° C., ramping up to about 400° C. at a rate of about 5° C./minute, and holding for about 30 minutes.

Figure 1F:
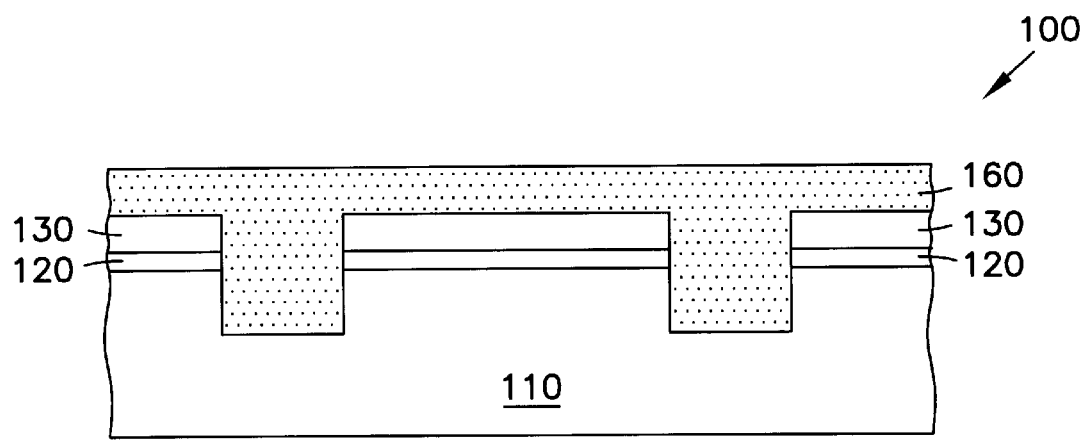

In FIG. 1F, voids or cells are formed in fill layer 160. In the case of a polymer fill layer 160, cells are formed by foaming the fill layer 160. In the case of an aerogel fill layer 160, cells are formed by driving off the liquid in the aerogel. Fill layer 160, as illustrated in FIG. 1F, is readily characterized by the number and size of the cells distributed therein. Cell, as used herein, refers to an enclosed region of air or other gaseous component, e.g., carbon dioxide ($CO_2$). The size of a cell is determined by the nominal diameter of the enclosed region of gas. Preferably, the size of cells according to the present invention is no greater than about 3.0 microns. More preferably, the size of cells according to the present invention is less than about 1.0 micron. In some applications, the size of cells according to the present invention is below 0.1 micron. It is desirable to have small cell sizes so that the fill layer 160 can be utilized in extremely small trenches. As long as the maximum cell size of the fill layer 160 is smaller than the width of the trenches 150, adequate electrical insulation can be provided without a potentially detrimental reduction in mechanical integrity of the trenches 150.

For embodiments containing polymeric material in fill layer 160, a supercritical fluid is utilized to convert at least a portion of the polymeric material, into a foamed polymeric material. Such use of supercritical fluids is known to facilitate formation of sub-micron cells in the foamed polymeric material. A gas is determined to be in a supercritical state (and is referred to as a supercritical fluid) when it is subjected to a combination of pressure and temperature above its critical point, such that its density approaches that of a liquid (i.e., the liquid and gas state coexist). A wide variety of compounds and elements can be converted to the supercritical state in order to be used to form the foamed polymeric material of fill layer 160.

Preferably, the supercritical fluid is selected from the group of ammonia ($NH_3$), an amine ($NR_3$), an alcohol (ROH), water ($H_2O$), carbon dioxide ($CO_2$), nitrous oxide ($N_2O$), a noble gas (e.g., He, Ne, Ar), a hydrogen halide (e.g., hydrofluoric acid (HF), hydrochloric acid (HCl), hydrobromic acid (HBr)), boron trichloride ($BCl_3$), chlorine ($Cl_2$), fluorine ($F_2$), oxygen ($O_2$) nitrogen ($N_2$), a hydrocarbon (e.g., dimethyl carbonate ($CO(OCH_3)_2$), methane ($CH_4$), ethane ($C_2H_6$), propane ($C_3H_8$), ethylene ($C_2H_4$), etc.), a fluorocarbon (e.g., $CF_4$, $C_2F_4$, $CH_3F$, etc.), hexafluoroacetylacetone ($C_5H_2F_6O_2$), and combinations thereof. Although these and other fluids may be used, it is preferable to have a fluid with a low critical pressure, preferably below about 100 atmospheres, and a low critical temperature of at or near room temperature. Further, it is preferred that the fluids be nontoxic and nonflammable. Likewise, the fluids should not degrade the properties of the polymeric material used nor surrounding structures of the integrated circuit device 100. For one embodiment, supercritical fluid $CO_2$ is utilized, due to the relatively inert nature of $CO_2$ with respect to most polymeric materials as well as other materials utilized in integrated circuit fabrication. Furthermore, the critical temperature (about 31° C.) and critical pressure (about 7.38 MPa, 72.8 atm) of $CO_2$ are relatively low. Thus, when $CO_2$ is subjected to a combination of pressure and temperature above about 7.38 MPa (72.8 atm) and about 31° C., respectively, it is in the supercritical state.

The structure illustrated in FIG. 1E is exposed to the supercritical fluid for a sufficient time period to foam at least a portion of the polymeric material of fill layer 160 as illustrated in FIG. 1F. Generally, the integrated circuit device 100 is placed in a processing chamber, and the temperature and pressure of the processing chamber are elevated above the temperature and pressure needed for creating and maintaining the particular supercritical fluid. After the polymeric material of fill layer 160 is exposed to the supercritical fluid for a sufficient period of time to saturate the polymeric material with supercritical fluid, the flow of supercritical fluid is stopped and the processing chamber is depressurized. Upon depressurization, the foaming of the polymeric material occurs as the supercritical state of the fluid is no longer maintained, and cells are formed in the polymeric material.

The foaming of a particular polymeric material may be assisted by subjecting the material to thermal treatment, e.g., a temperature suitable for assisting the foaming process but below temperatures which may degrade the material. Further, the depressurization to ambient pressure is carried out at any suitable speed, but the depressurization must at least provide for conversion of the polymeric material before substantial diffusion of the supercritical fluid out of the polymeric material occurs. Foaming of the polymeric material occurs over a short period of time. The period of time that it takes for the saturated polymeric material to be completely foamed depends on the type and thickness of the polymeric material and the temperature/pressure difference between the processing chamber and ambient environment. The specific time, temperature, pressure combination used depends on the diffusion rate of the gas through the polymer and the thickness of the layer of polymer used. It should be readily apparent that other foaming techniques may be used in place of or in combination with that described herein in accordance with the present invention. Foams may also be formed by use of block co-polymers as described in "Low Dielectric Constant Polyimides and Polyimide Nanofoams," by R. D. Miller et al., *Proceedings From the Seventh Meeting of the Dupont Symposium on Polyimides in Microelectronics*, Wilmington, Del., Sep. 16–18, 1996. However, use of such co-polymers have the disadvantage in that the chemical reaction must be initiated and controlled on the surface of the semiconductor wafer.

Figure 1G:
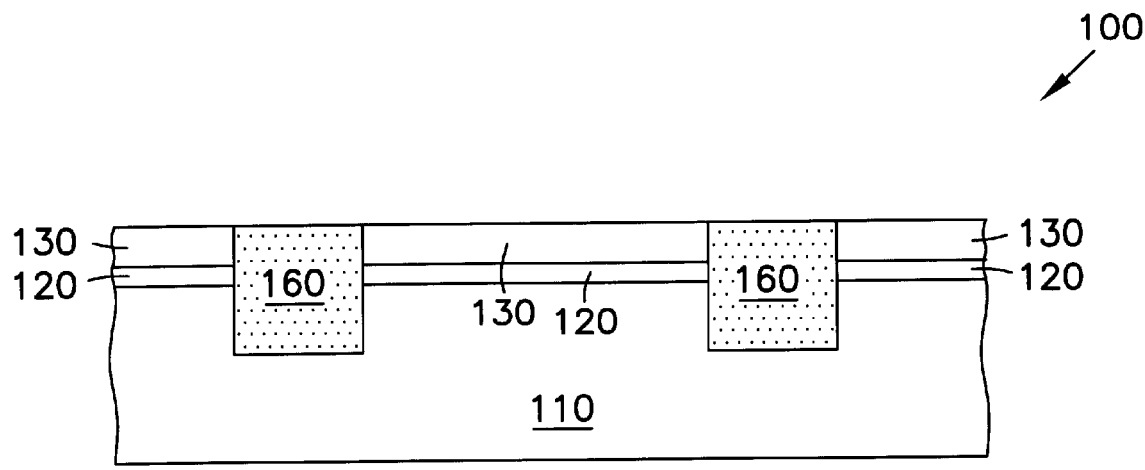

In FIG. 1G, the integrated circuit device 100 is planarized such that a top surface of the fill layer 160 in trenches 150 is substantially even with the uppermost layer. In this example, the planarization utilizes the polysilicon layer 130 as the stopping layer. Planarization may include such techniques as etch-back processes or chemical-mechanical planarization (CMP) processes.

Figure 1H:
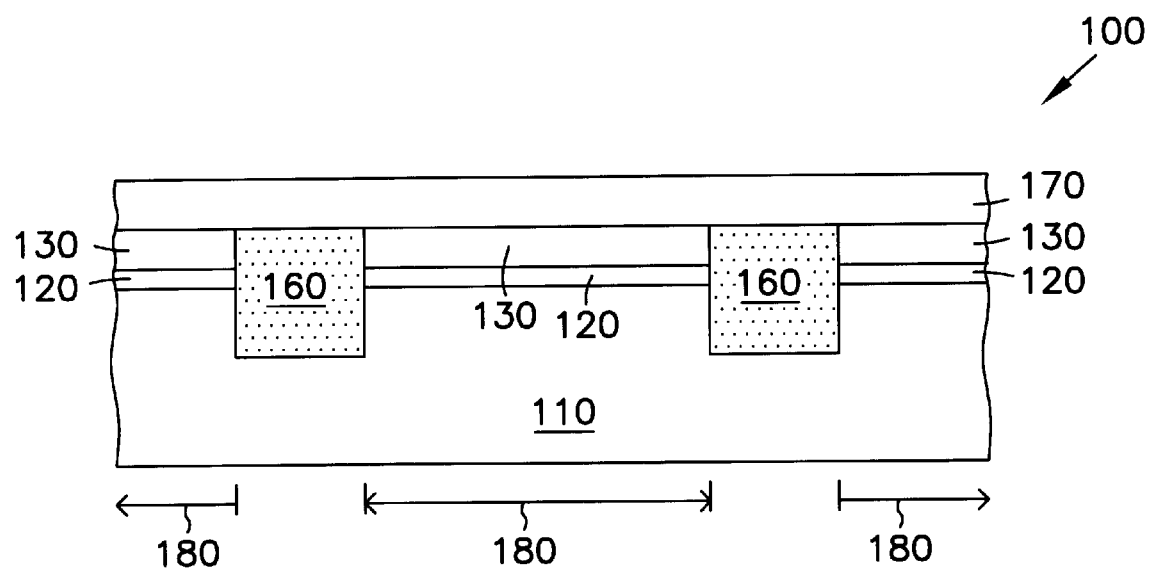

In FIG. 1H, a conductor layer 170 is formed of conductive material. For one embodiment, conductor layer 170 may contain a metal such as aluminum (Al), copper (Cu), silver (Ag), gold (Au), or alloys of the aforementioned metals, etc. For another embodiment, the metal is a refractory metal. The refractory metals of chromium (Cr), cobalt (Co), hafnium (Hf), molybdenum (Mo), niobium (Nb), tantalum (Ta), titanium (Ti), tungsten (W), vanadium (V) and zirconium (Zr) are included in this definition. For a further embodiment, the refractory metal is tungsten.

Figure 1I:
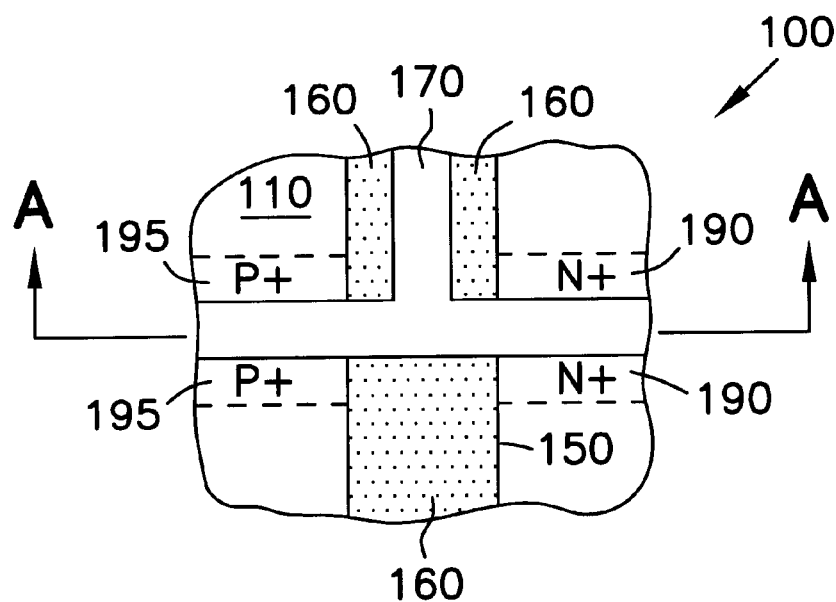
FIG. 1I is a top view of an integrated circuit device having two active semiconductor devices isolated by an interposing trench in accordance with the processing stages of FIGS. 1A–1H.
Figure 1J:
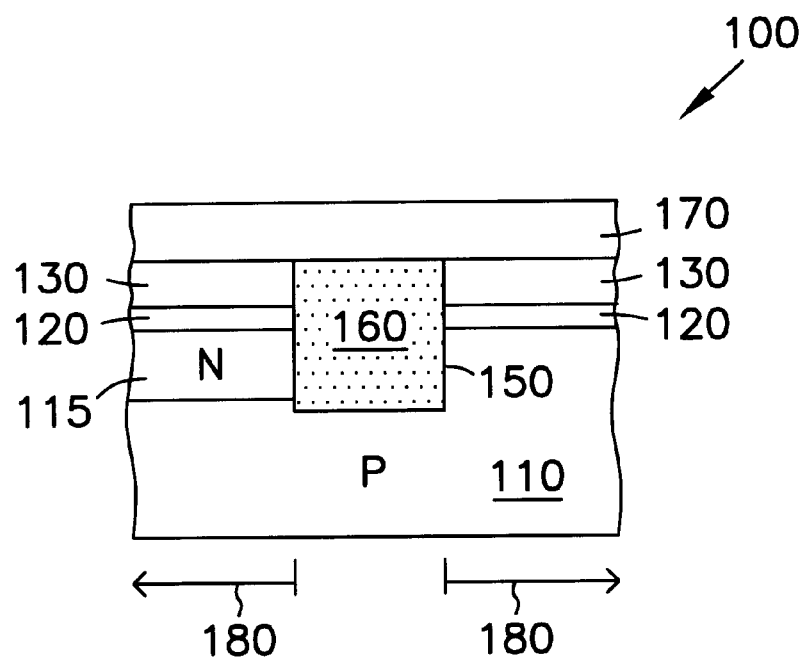
FIG. 1J is a cross-sectional view of the integrated circuit device of FIG. 1I.

Conductor layer 170 may be used to couple semiconductor devices formed in one active region 180 with semiconductor devices formed in other active regions 180 of integrated circuit device 100. The various layers can of course be patterned to define semiconductor devices, e.g., FETs. FIG. 1I is one example of how the layers can be patterned to define FETs such as in a complementary metal oxide semiconductor (CMOS) device. In FIG. 1I, P-type dopants have been used on one side of a trench 150 to define an N-channel device while N-type dopants have been used on the other side of the trench 150 to define a P-channel device. FIG. 1J is a cross-sectional view of the CMOS device of FIG. 1I taken at line A—A showing the N-well 115 formed in the P-type substrate 110, as well as the polysilicon layer 130 and gate oxide layer 120.

While the foregoing embodiments have been described having the gate oxide layer 120, polysilicon layer 130 and conductor layer 170, these layers are merely examples. Formation of trenches 150 and their subsequent refilling with fill layer 160 is not limited to use the foregoing ancillary layers.

FIGS. 2A–2H depict cross-sectional views of a portion of an integrated circuit device 200 at various processing stages in accordance with another embodiment of the invention. The general processing described herein can be adapted to a variety of integrated circuit devices. As one example, additional processing steps well understood by those skilled in the art may be utilized to define field-effect transistors (FETs) for such integrated circuit devices as a memory device. For the embodiment of FIGS. 2A–2H, an air gap is utilized as the trench "fill" material in place of the polymer or aerogel as described with reference to FIGS. 1A–1H. Use of an air gap is facilitated through the use of a temporary polymer plug as described below. An air gap is a cell having a cell size equal to the size of the trench and containing air or other ambient gaseous component.

Figure 2A:
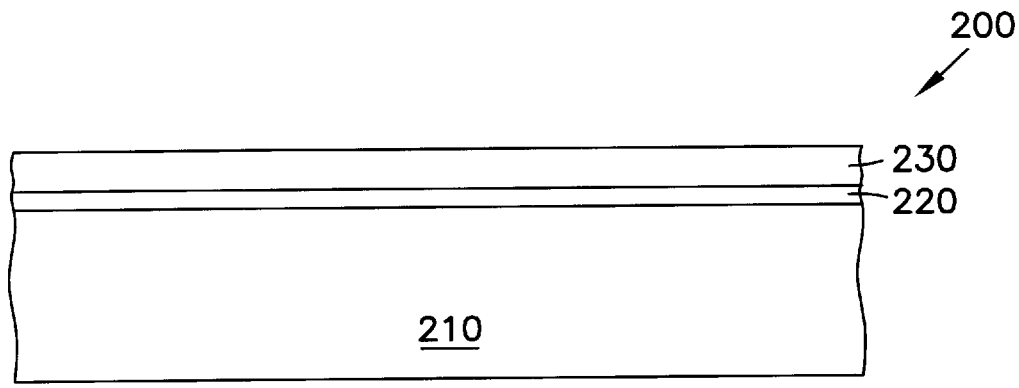
FIGS. 2A–2H are cross-sectional views of an integrated circuit device at various processing stages in accordance with another embodiment of the invention.

In FIG. 2A, a gate oxide layer 220 is formed as a first layer overlying a substrate 210. A polysilicon layer 230 is formed as a second layer overlying the substrate 210 and the gate oxide layer 220.

Figure 2B:
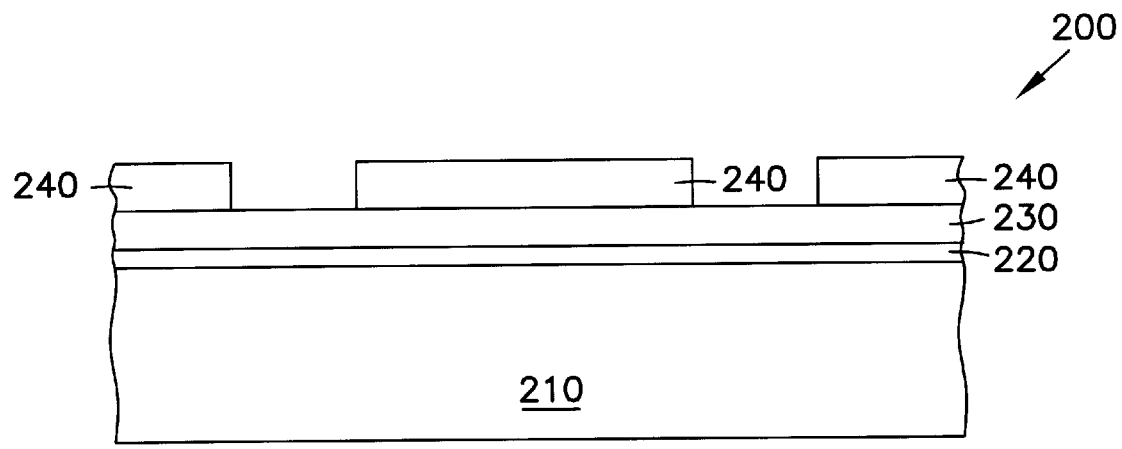
Figure 2C:
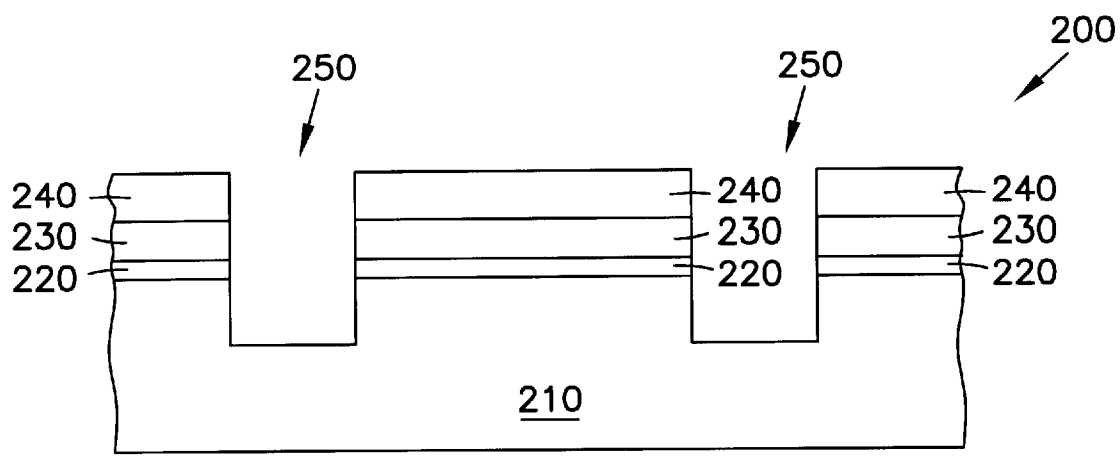
Figure 2D:
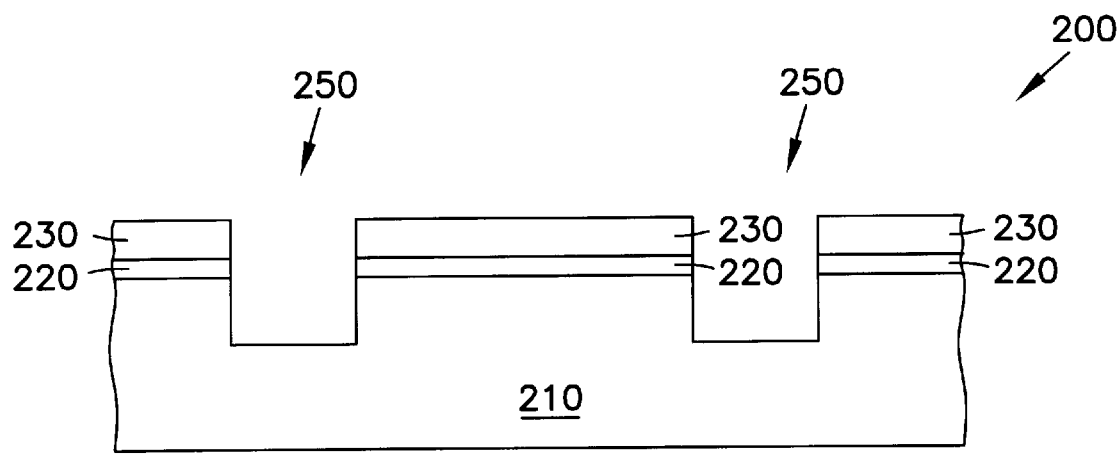

In FIG. 2B, a mask layer 240 is formed overlying the polysilicon layer 230 and patterned to expose areas defining future trenches. In FIG. 2C, a portion of the polysilicon layer 230, the gate oxide layer 220 and the substrate 210 are removed to form trenches 250 having a bottom defined by the substrate 210 and sidewalls defined by the substrate 210, gate oxide layer 220 and polysilicon layer 230. In FIG. 2D, the mask layer 240 is removed.

Figure 2E:
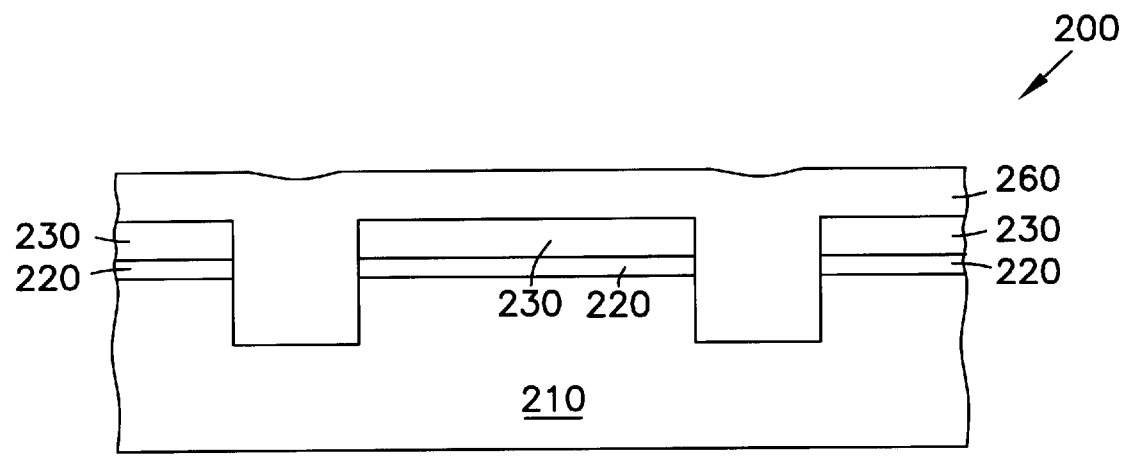

In FIG. 2E, a fill layer 260 is formed overlying the polysilicon layer 230 and filling the trenches 250. For one embodiment, fill layer 260 contains a polymer as defined herein. For another embodiment, fill layer 260 contains methylsilsesquioxane (MSSQ). A wide variety of methods are available for applying the fill layer 260 to the substrate 212. For example, spin-on coating, spraying, and dipping may be utilized to apply polymers to the substrate 210. Furthermore, a combination of such application techniques or any other techniques known to one skilled in the art may be used.

The polymeric material of fill layer 260 is cured, if necessary, to provide structural integrity, i.e., to convert the polymeric material of fill layer 260 to a solid capable of supporting subsequently formed layers. Techniques for curing polymeric material as applied to the embodiment of FIGS. 1A–1H also apply to the present embodiment.

Figure 2F:
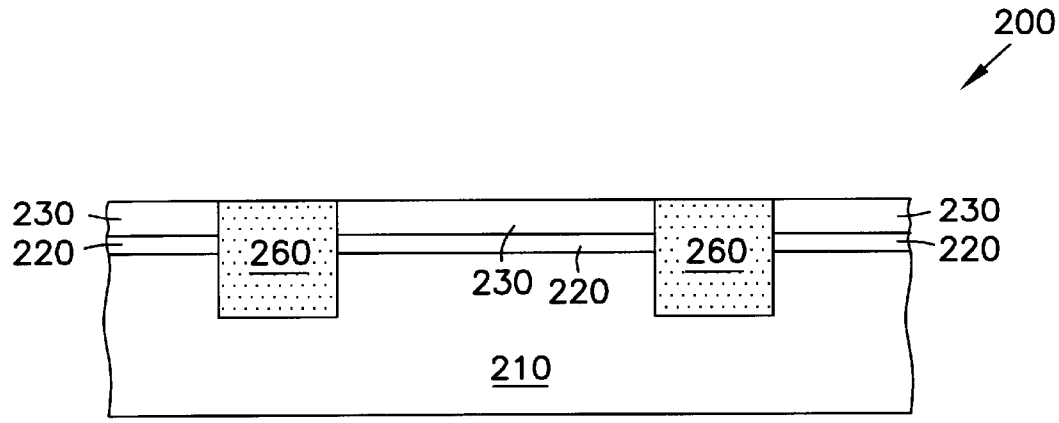

In FIG. 2F, the integrated circuit device 200 is planarized such that a top surface of the fill layer 260 in trenches 250 is substantially even with the uppermost layer. In this example, the planarization utilizes the polysilicon layer 230 as the stopping layer. Planarization may include such techniques as etch-back processes or chemical-mechanical planarization (CMP) processes. As will be apparent in subsequent processing, the fill layer 260 is a temporary plug.

Figure 2G:
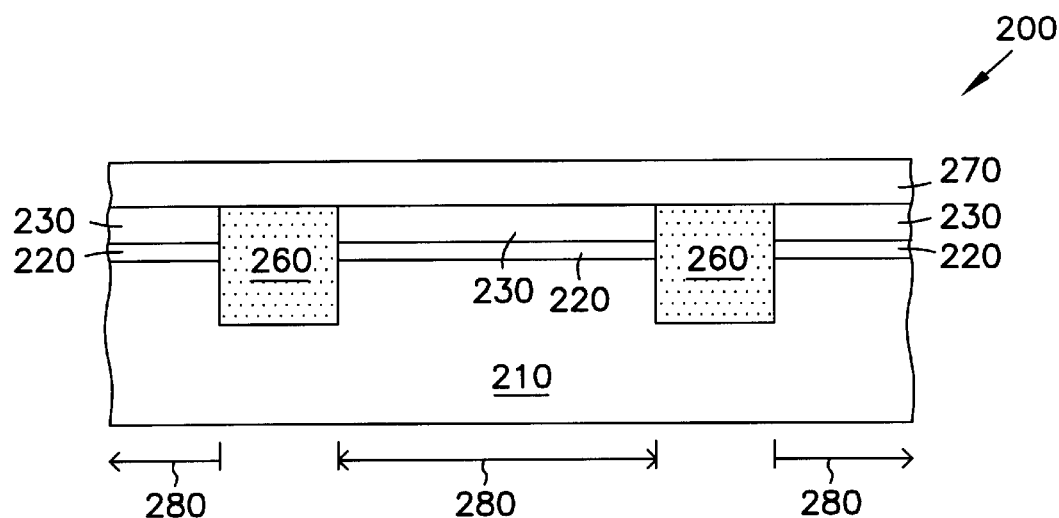

In FIG. 2G, a conductor layer 270 is formed of conductive material. For one embodiment, conductor layer 270 may contain a metal such as aluminum (Al), copper (Cu), silver (Ag), gold (Au), or alloys of the aforementioned metals, etc. For another embodiment, the metal is a refractory metal. The refractory metals of chromium (Cr), cobalt (Co), hafnium (Hf), molybdenum (Mo), niobium (Nb), tantalum (Ta), titanium (Ti), tungsten (W), vanadium (V) and zirconium (Zr) are included in this definition. For a further embodiment, the refractory metal is tungsten.

Conductor layer 270 may be used to couple semiconductor devices formed in one active region 280 with semiconductor devices formed in other active regions 280 of integrated circuit device 200. The various layers can of course be patterned to define semiconductor devices and wiring layer(s), e.g., FETs.

Figure 2H:
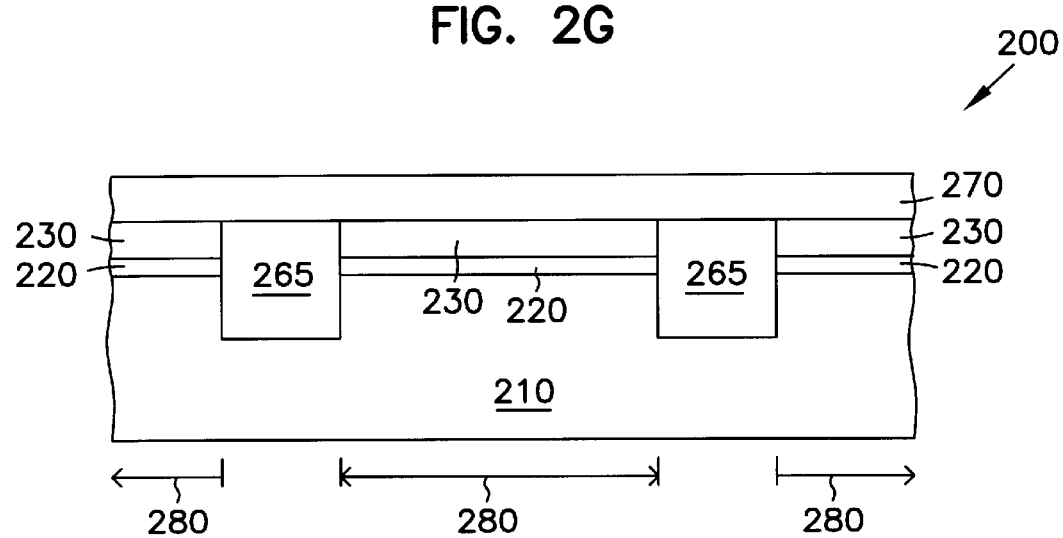

Following definition of semiconductor devices and wiring layer(s), fill layer 260 is removed to form air gaps 265 in trenches 250 as shown in FIG. 2H. In essence, the air gap 265 fills the trench 250 upon removal of the fill layer 260, the fill layer 260 acting as a temporary plug. In the case of organic polymers, an oxygen or ozone plasma can be utilized to decompose the polymeric material of fill layer 260. It is noted that definition of the conductor layer 270 necessarily exposes at least some portion of the fill layer 260 in order to effect removal.

If the air gaps of trenches 250 are not the final insulation medium, additional processing stages can be utilized to form alternate insulators in the trenches 250. As one example, a polymeric material can be deposited in trenches 250 through the exposed portions and cured and foamed as described previously. Alternatively, an aerogel material can be deposited in the trenches 250 through the exposed portions and cured as described previously. Such embodiments may be desirable when the desired fill material is incompatible with the formation of conductor layer 170 or subsequent processing for the definition of the semiconductor devices. By utilizing a temporary plug during these incompatible steps, and forming the desired fill material subsequent to such processing, the designer is afforded additional insulation alternatives.

The isolation trench structures and methods of forming the same, as described above, are used in various embodiments with substrate structures as described below, and as shown in FIGS. 3–6B.

Figure 3:
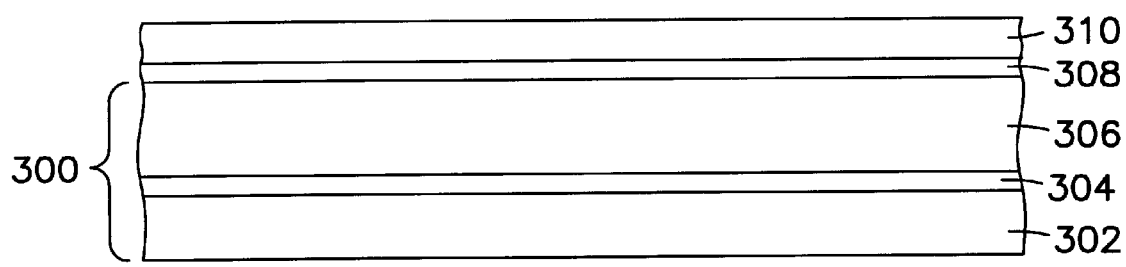
FIG. 3 is a cross-sectional view of an integrated circuit device during a processing stage using one substrate embodiment.
Figure 4:
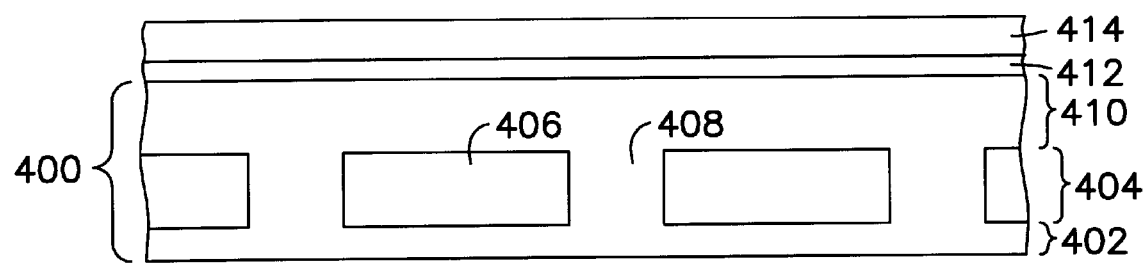
FIG. 4 is a cross-sectional view of an integrated circuit device during a processing stage using another substrate embodiment.

FIGS. 3 and 4 show two respective embodiments of substrates. FIG. 3 shows a substrate 300 with a semiconductor layer over a dielectric layer. One example of this type of substrate is a typical silicon-on-insulator (SOI) configuration. The substrate 300 in the Figure is shown in a condition similar to FIGS. 1A and 2A with a gate oxide layer 308 and a polysilicon layer 310 coupled to the surface of the substrate 300. Although a gate oxide 308 and polysilicon layer 310 are shown in this example, other methods of forming active areas on a substrate need not include these elements.

The typical silicon-on-insulator (SOI) substrate 300 includes a bulk silicon portion 302, a dielectric layer 304, and an upper silicon portion 306. Active regions or electronic devices are fabricated in the upper silicon portion 306 and isolated from the bulk silicon portion 302. Although alternative semiconductors and dielectric layers are included within the scope of the invention, this example uses silicon for the semiconductor layer included in the upper silicon portion 306, and silicon dioxide ($SiO_2$) for the dielectric layer 304.

In one embodiment the SOI substrate 300 is formed using a composite wafer process. An oxide layer is placed on the surface of one wafer, and the resulting structure is bonded to a second wafer. The thickness of the wafer within which the devices to be placed is then thinned down such that the oxide layer will be just below the completed devices. In another embodiment, a layer of $Al_2O_3$ is utilized as the dielectric layer under the devices to form a silicon-on-sapphire (SOS) substrate.

FIG. 4 shows an additional substrate embodiment 400. Substrate 400 includes a bulk semiconductor portion 402, a dielectric layer 404, and an upper semiconductor portion 410. Similar to FIG. 3, a gate oxide 412 and a polysilicon layer 414 are included for illustration over the substrate 400. The dielectric layer 404 includes a number of gaps 406 spaced between solid regions 408. The gaps 406 are filled with air, or other gas materials. Gasses such as air have very high breakdown values, and are therefore extremely good insulators. The low dielectric constant of air therefore reduces the coupling of the devices to the substrate.

Active regions or electronic devices are fabricated in the upper semiconductor portion 410 of the substrate 400 and are at least partially isolated from the bulk semiconductor portion 402. In one embodiment, the semiconductor portions 402 and 410 include silicon. The solid portions 408, in one embodiment, include silicon. Alternate materials that are conducive to preferential etching are also acceptable.

In one fabrication method of substrate 400, the gaps 406 are formed by a preferential etch step that is performed through an opening (not shown) in the upper semiconductor layer 410. The preferential etch removes material in the dielectric layer 404 preferentially over material in the upper semiconductor layer 410. When silicon is used in the upper semiconductor layer, this configuration is frequently called silicon-on-nothing (SON). The gaps 406 can also be formed using a process similar to that described in a co-pending application Ser. No. 09/940,792. Although the gaps 406 in one embodiment are continuous between solid regions 408, the gaps 406 in an alternative embodiment are filled with a number of gaseous cells.

Figure 5A:
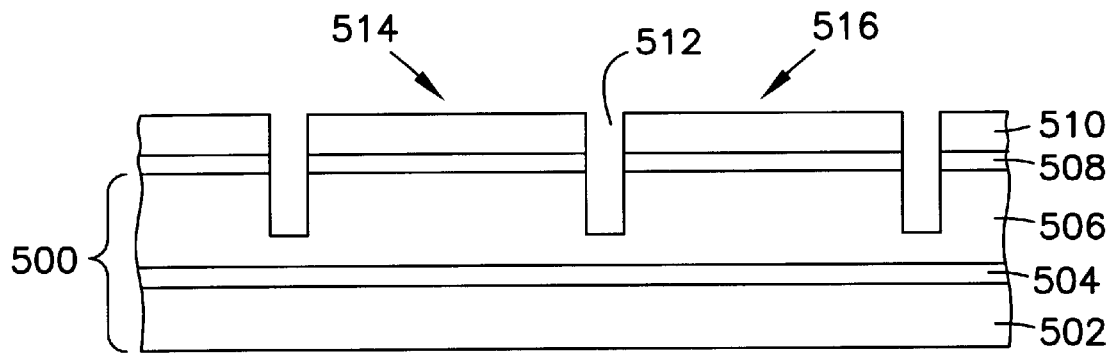
FIGS. 5A–5C are cross-sectional views of various integrated circuit devices according to various trench configurations using one substrate embodiment.
Figure 5B:
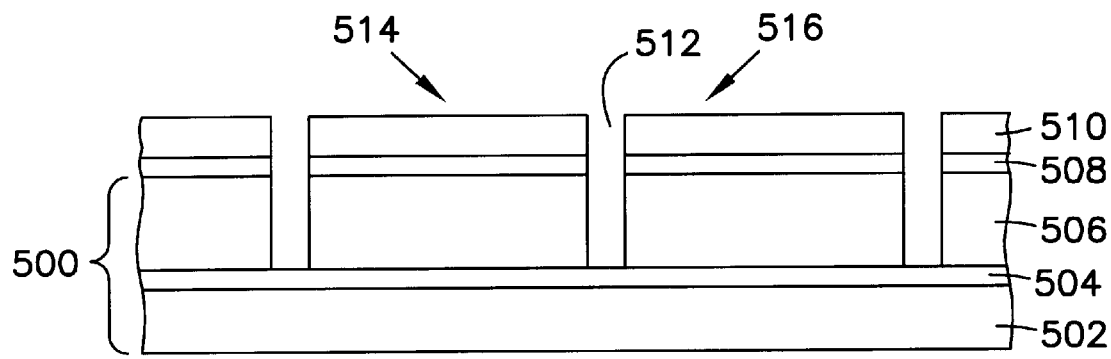
Figure 5C:
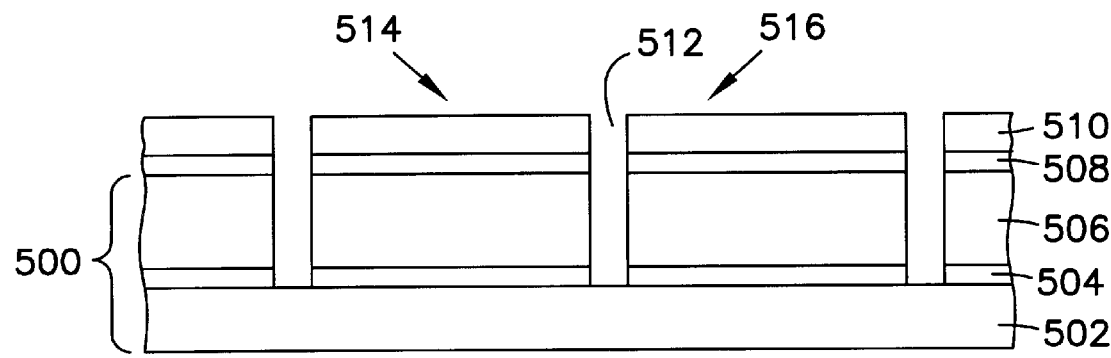

FIGS. 5A–C illustrate variations in the STI trenches according to various embodiments of the invention. In FIG. 5A, a trench 512 is formed through a polysilicon layer 510 and a gate oxide layer 508, into an upper semiconductor portion 506 of substrate 500. The substrate 500 shown includes a bulk semiconductor portion 502 and the upper semiconductor portion 506, separated by a dielectric layer 504.

In FIG. 5A, the trench 512 extends down into the upper semiconductor portion 506 to a point adjacent to, but not contacting the dielectric layer 504. The trench 512 at least partially isolates a first active region 514 from a second active region 516. In FIG. 5B, the trench 512 further extends to a point of contact with the dielectric layer 504. In FIG. 5C, the trench 512 extends at least partially into the dielectric layer 504.

Figure 6A:
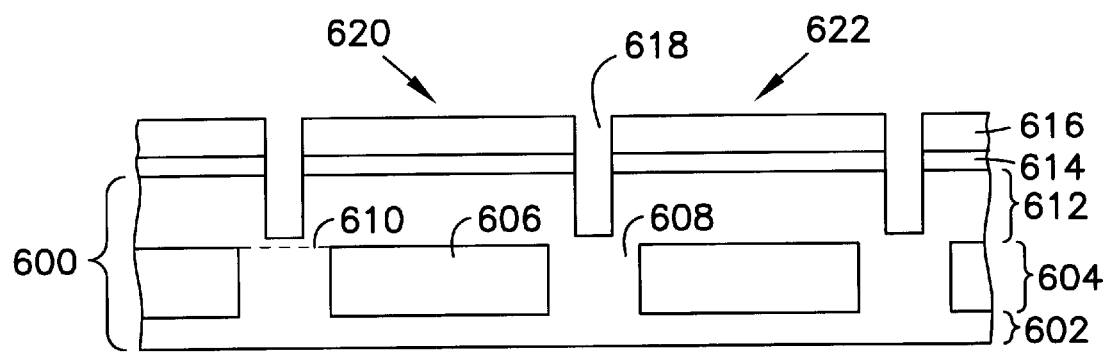
FIGS. 6A–6B are cross-sectional views of various integrated circuit devices according to various trench configurations using another substrate embodiment.
Figure 6B:
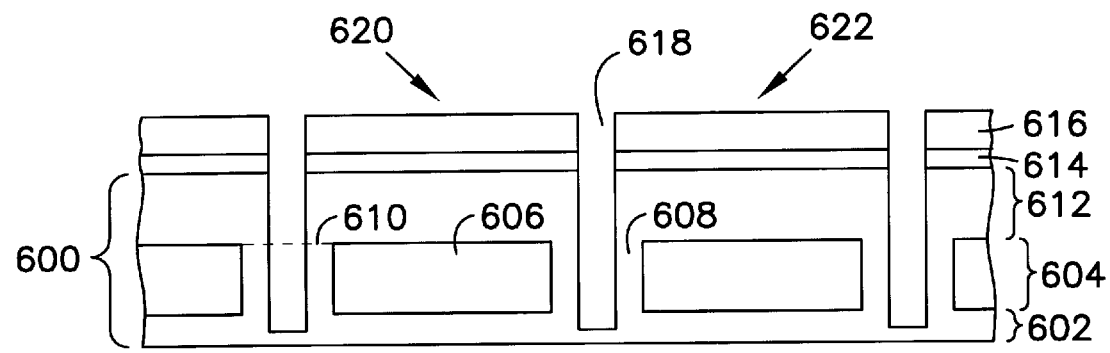

FIGS. 6A and 6B illustrate further variations in the STI trenches according to various embodiments of the invention. In FIG. 6A, a trench 618 is formed through a polysilicon layer 616 and a gate oxide layer 614, into an upper semiconductor layer 612 of substrate 600. The substrate 600 shown includes a bulk semiconductor portion 602 and the upper semiconductor portion 612, separated by a dielectric layer 604. In FIGS. 6A and 6B, the dielectric layer includes gap portions 606 and solid portions 608 similar to the substrate embodiment from FIG. 4.

In FIG. 6A, the trench 618 extends down into the upper semiconductor portion 612 to a point adjacent to the dielectric layer 604, but not below a top level 610 of the dielectric layer 604. The trench 618 at least partially isolates a first active region 620 from a second active region 622. In FIG. 6B, the trench 618 further extends at least partially into the dielectric layer 604, or past the top level 610 of the dielectric layer 604.

The embodiments described above can be utilized to provide isolation for active regions containing semiconductor devices, such as FETs in a memory device. The invention, however, is not so limited. The substrate structures and isolation trench structures of the embodiments described above are incorporated into embodiments of higher level devices as described below and as shown in FIGS. 7–13.

Memory Devices

Figure 7:
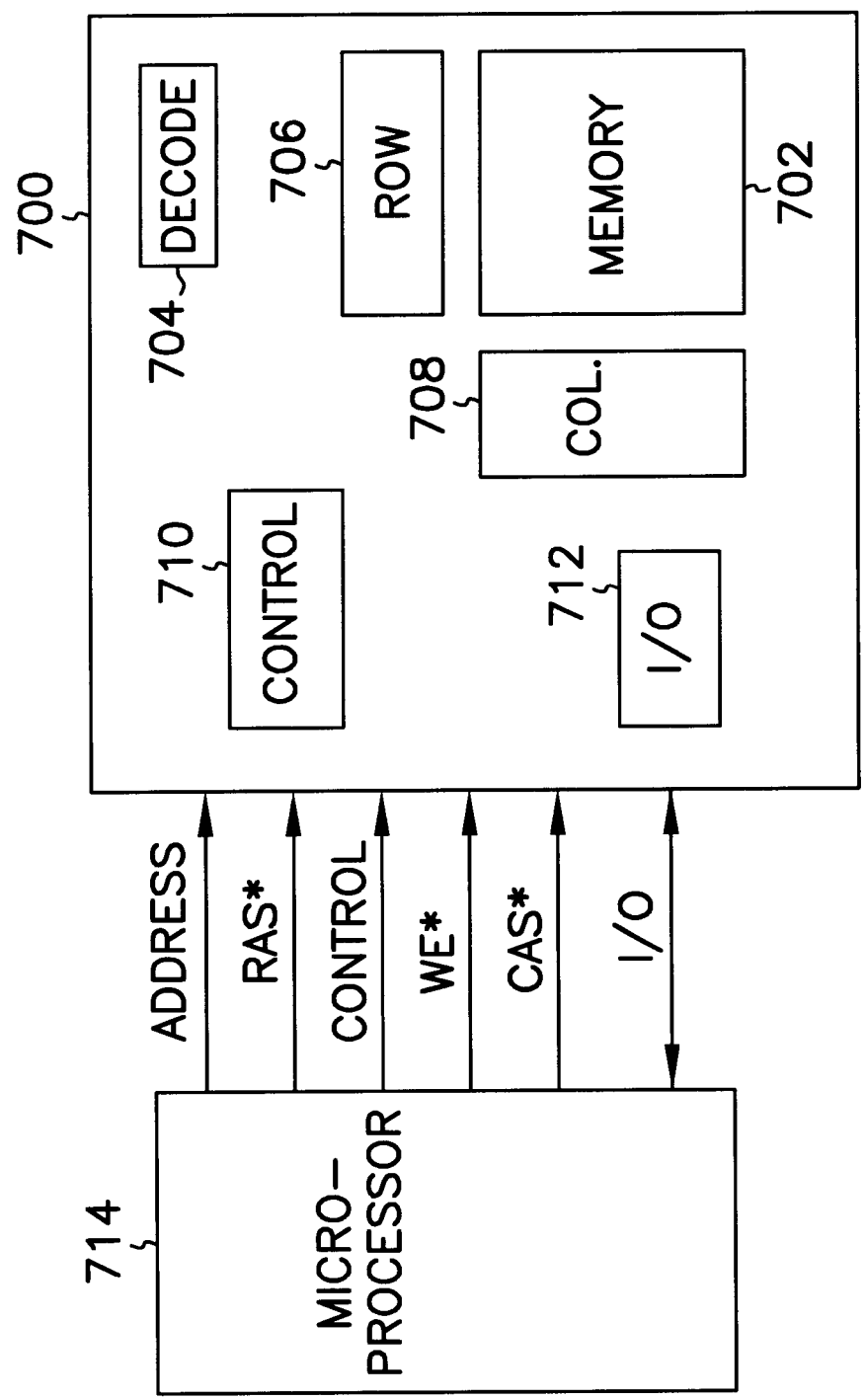
FIG. 7 is a block diagram of an integrated circuit memory device in accordance with an embodiment of the invention.

FIG. 7 is a simplified block diagram of a memory device according to one embodiment of the invention. The memory device 700 includes an array of memory cells 702, address decoder 704, row access circuitry 706, column access circuitry 708, control circuitry 710, and Input/Output circuit 712. The memory can be coupled to an external microprocessor 714, or memory controller for memory accessing. The memory receives control signals from the processor 714, such as WE*, RAS* and CAS* signals. The memory is used to store data which is accessed via I/O lines. It will be appreciated by those skilled in the art that additional circuitry and control signals can be provided, and that the memory device of FIG. 14 has been simplified to help focus on the invention. The memory device 700 has at least two active semiconductor devices, such as access transistors of adjacent memory cells, isolated by an interposing trench containing cells of gaseous components, e.g., a trench filled with a foamed polymer, a cured aerogel or an air gap as described in the foregoing embodiments.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

As recognized by those skilled in the art, memory devices of the type described herein are generally fabricated as an integrated circuit device containing a variety of semiconductor devices. The integrated circuit is supported by a substrate. Integrated circuit devices are typically repeated multiple times on each substrate. The substrate is further processed to separate the integrated circuit devices into dies as is well known in the art.

Semiconductor Dies

Figure 8:
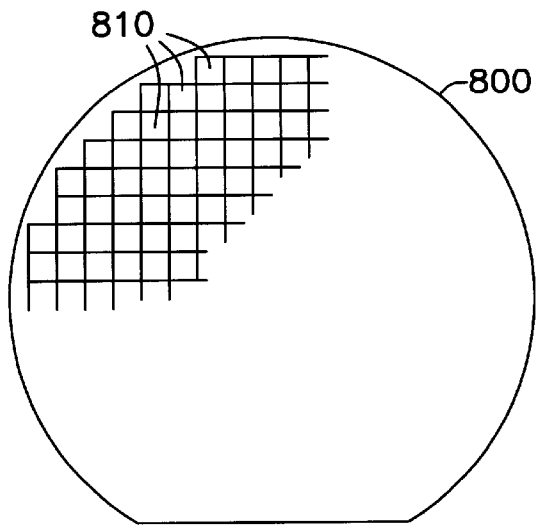
FIG. 8 is an elevation view of a wafer containing semiconductor dies in accordance with an embodiment of the invention.

With reference to FIG. 8, in one embodiment, a semiconductor die 810 is produced from a wafer 800. A die is an individual pattern, typically rectangular, on a substrate that contains a variety of semiconductor devices of an integrated circuit device. At least two active semiconductor devices are isolated by an interposing trench containing cells of gaseous components, e.g., a trench filled with a foamed polymer, a cured aerogel or an air gap. A semiconductor wafer will typically contain a repeated pattern of such dies containing the same functionality. Die 810 may contain circuitry for the inventive memory device, as discussed above. Die 810 may further contain additional circuitry to extend to such complex devices as a monolithic processor with multiple functionality. Die 810 is typically packaged in a protective casing (not shown) with leads extending therefrom (not shown) providing access to the circuitry of the die for unilateral or bilateral communication and control.

Circuit Modules

Figure 9:
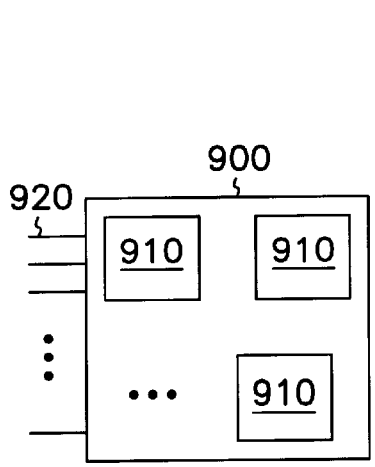
FIG. 9 is a block diagram of an exemplary circuit module in accordance with an embodiment of the invention.

As shown in FIG. 9, two or more dies 910 maybe combined, with or without protective casing, into a circuit module 900 to enhance or extend the functionality of an individual die 910. Circuit module 900 may be a combination of dies 910 representing a variety of functions, or a combination of dies 910 containing the same functionality. One or more dies 910 of circuit module 900 contain at least two active semiconductor devices isolated by an interposing trench containing cells of gaseous components, e.g., a trench filled with a foamed polymer, a cured aerogel or an air gap.

Some examples of a circuit module include memory modules, device drivers, power modules, communication modems, processor modules and application-specific modules and may include multilayer, multichip modules. Circuit module 900 may be a subcomponent of a variety of electronic systems, such as a clock, a television, a cell phone, a personal computer, an automobile, an industrial control system, an aircraft and others. Circuit module 900 will have a variety of leads 920 extending therefrom and coupled to the dies 910 providing unilateral or bilateral communication and control.

Figure 10:
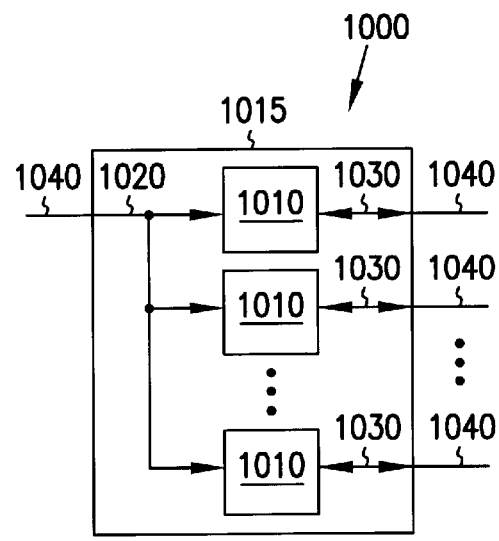
FIG. 10 is a block diagram of an exemplary memory module in accordance with an embodiment of the invention.

FIG. 10 shows one embodiment of a circuit module as memory module 1000. Memory module 1000 contains multiple memory devices 1010 contained on support 1015, the number depending upon the desired bus width and the desire for parity. Memory module 1000 accepts a command signal from an external controller (not shown) on a command link 1020 and provides for data input and data output on data links 1030. The command link 1020 and data links 1030 are connected to leads 1040 extending from the support 1015. Leads 1040 are shown for conceptual purposes and are not limited to the positions shown in FIG. 10.

Electronic Systems

Figure 11:
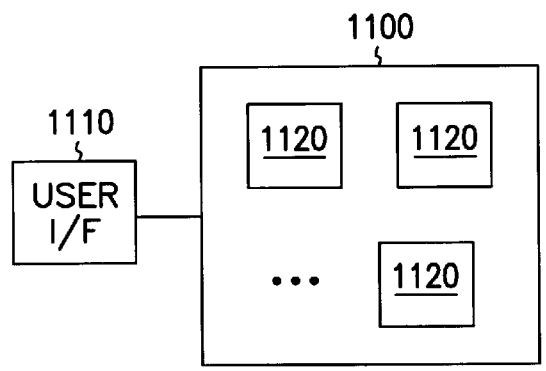
FIG. 11 is a block diagram of an exemplary electronic system in accordance with an embodiment of the invention.

FIG. 11 shows an electronic system 1100 containing one or more circuit modules 1120. Electronic system 1100 generally contains a user interface 1110. User interface 1110 provides a user of the electronic system 1100 with some form of control or observation of the results of the electronic system 1100. Some examples of user interface 1110 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1110 may further describe access ports provided to electronic system 1100. Access ports are used to connect an electronic system to the more tangible user interface components previously exemplified. One or more of the circuit modules 1120 may be a processor providing some form of manipulation, control or direction of inputs from or outputs to user interface 1110, or of other information either preprogrammed into, or otherwise provided to, electronic system 1100. As will be apparent from the lists of examples previously given, electronic system 1100 will often contain certain mechanical components (not shown) in addition to circuit modules 1120 and user interface 1110. It will be appreciated that the one or more circuit modules 1120 in electronic system 1100 can be replaced by a single integrated circuit. Furthermore, electronic system 1100 may be a subcomponent of a larger electronic system.

Figure 12:
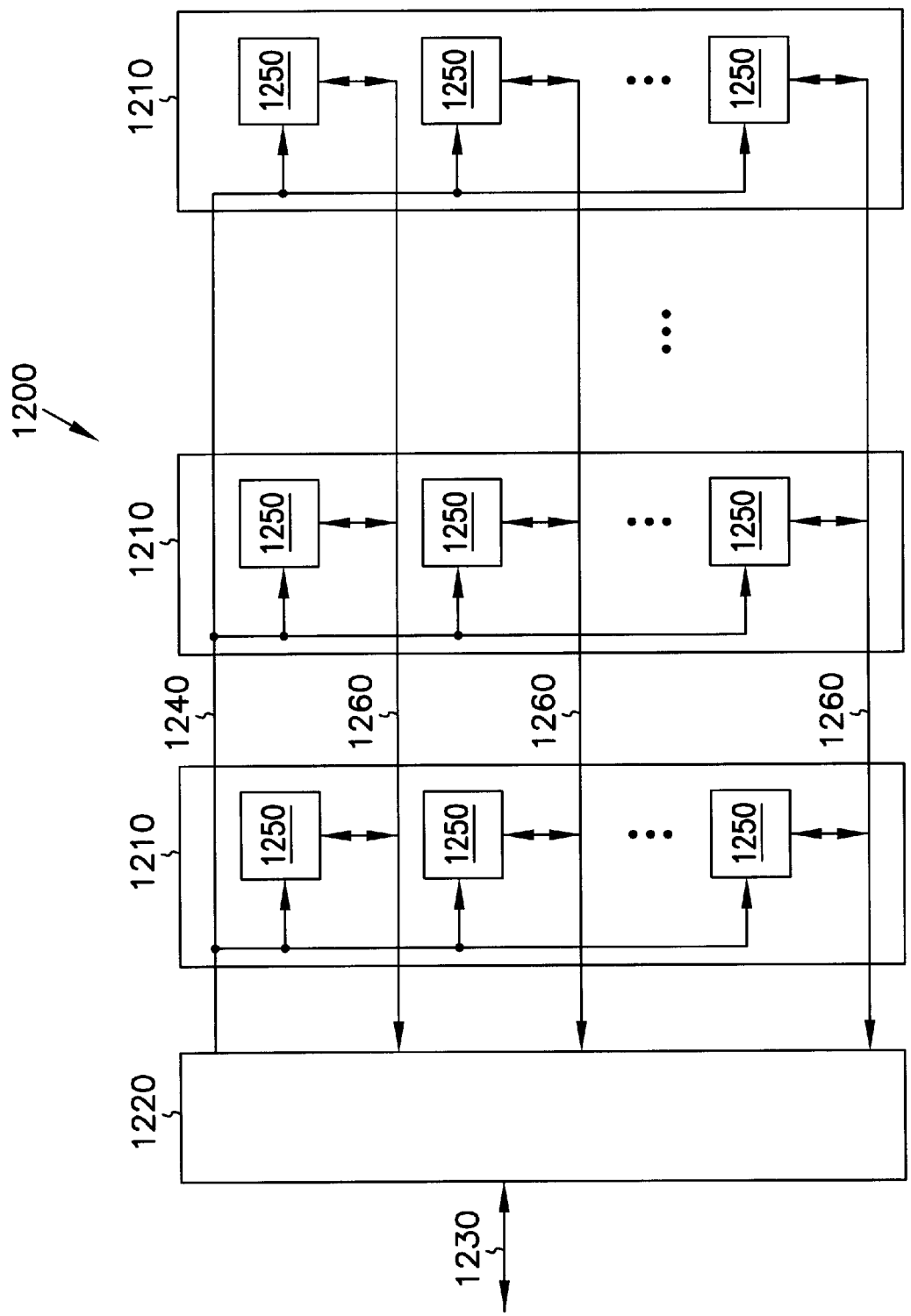
FIG. 12 is a block diagram of an exemplary memory system in accordance with an embodiment of the invention.

FIG. 12 shows one embodiment of an electronic system as memory system 1200. Memory system 1200 contains one or more memory modules 1210 and a memory controller 1220. Memory controller 1220 provides and controls a bidirectional interface between memory system 1200 and an external system bus 1230. Memory system 1200 accepts a command signal from the external bus 1230 and relays it to the one or more memory modules 1210 on a command link 1240. Memory system 1200 provides for data input and data output between the one or more memory modules 1250 and external system bus 1230 on data links 1260.

Figure 13:
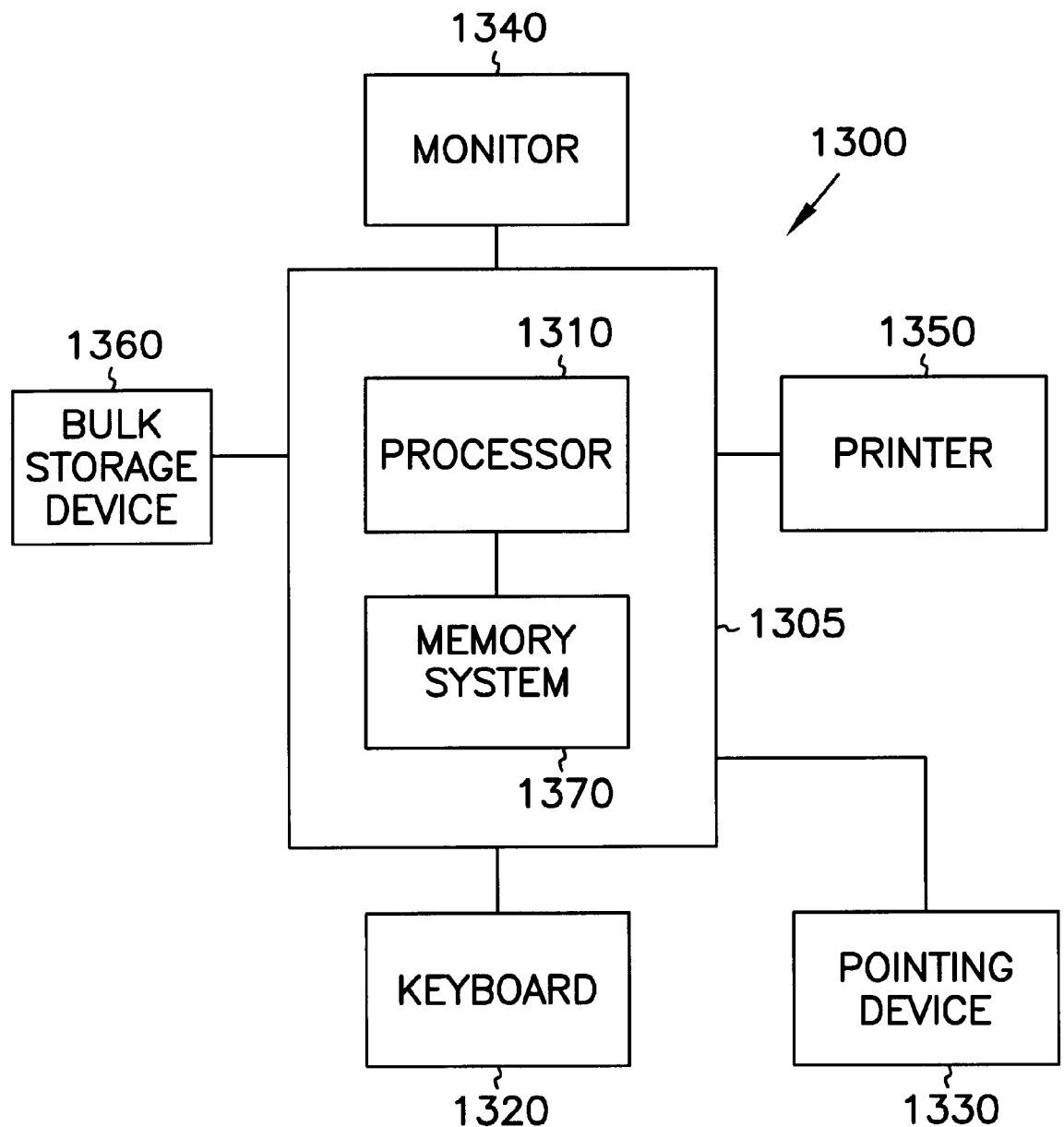
FIG. 13 is a block diagram of an exemplary computer system in accordance with an embodiment of the invention.

FIG. 13 shows a further embodiment of an electronic system as a computer system 1300. Computer system 1300 contains a processor 1310 and a memory system 1370 housed in a computer unit 1305. Computer system 1300 is but one example of an electronic system containing another electronic system, i.e., memory system 1370, as a subcomponent. Computer system 1300 optionally contains user interface components. Depicted in FIG. 13 are a keyboard 1320, a pointing device 1330, a monitor 1340, a printer 1350 and a bulk storage device 1360. It will be appreciated that other components are often associated with computer system 1300 such as modems, device driver cards, additional storage devices, etc. It will further be appreciated that the processor 1310 and memory system 1370 of computer system 1300 can be incorporated on a single integrated circuit. Such single package processing units reduce the communication time between the processor and the memory circuit.

Conclusion

Techniques of shallow trench isolation and devices produced therefrom have been described using low dielectric constant materials. The techniques of shallow trench isolation utilize foamed polymers, cured aerogels or air gaps as the insulation medium. Such techniques facilitate lower dielectric constants than the standard silicon dioxide due to the cells of gaseous components inherent in foamed polymers, cured aerogels or air gaps. Lower dielectric constants reduce capacitive coupling concerns and thus permit higher device density in an integrated circuit device.

For the foregoing embodiments, it is not necessary that all polymeric insulating material within an integrated circuit be converted to foamed insulating material. It is only necessary to convert a portion of the polymeric material to the foamed polymeric material to obtain the benefits of the present invention. Furthermore, foamed polymeric material of the present invention can be utilized in conjunction with other insulating material. For example, adjacent layers of foamed polymeric material and silicon dioxide insulating material can be utilized in regions of an integrated circuit where different electrical isolation is desired.

Additionally, techniques of isolation and devices produced therefrom have been described using various substrate isolation structures. Substrates may include silicon-on-insulator (SOI) and silicon-on-nothing (SON).

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. As an example, sidewall or channel stop implantation may be performed in the trench sidewalls prior to formation of the fill layer. Accordingly, this application is intended to cover any adaptations or variations of the invention. It is manifestly intended that this invention be limited only by the following claims and equivalents thereof.

What is claimed is:

1. A method of isolating a first active region from a second active region in an integrated circuit device, comprising:
   forming a substrate, including:
      forming a dielectric layer;
      forming a semiconductor layer coupled to the dielectric layer;
      forming a trench in the substrate, wherein the first active region is on a first side of the trench and the second active region is on a second side of the trench;
   filling the trench with a polymeric material; and
   foaming the polymeric material.

2. The method of claim 1, wherein forming the dielectric layer includes forming a silicon dioxide (SiO2) layer.

3. The method of claim 1, wherein forming the dielectric layer includes forming an air gap.

4. The method of claim 1, wherein forming the trench in the substrate includes forming a trench to a depth of the dielectric layer.

5. The method of claim 1, wherein forming the trench in the substrate includes forming a trench to a depth below a top of the dielectric layer.

6. The method of claim 1, wherein filling the trench with a polymeric material includes filling the trench with a polymeric material selected from the group consisting of methylsilsesquioxane, polyimides and polynorbornenes.

7. The method of claim 1, wherein filling the trench with a polymeric material includes filling the trench with a polymeric material selected from the group consisting of Type I and Type III polyimides.

8. The method of claim 1, wherein foaming the polymeric material further comprises:
   exposing the polymeric material to a supercritical fluid, thereby forming a saturated polymeric material; and
   depressurizing the saturated polymeric material, thereby forming cells.

9. The method of claim 8, wherein exposing the polymeric material to the supercritical fluid includes exposing the polymeric material to supercritical carbon dioxide.

10. The method of claim 1, wherein the method is performed in the order presented.

11. A method of isolating a first active region from a second active region in an integrated circuit device, comprising:
   forming a substrate, including:
      forming a dielectric layer;
      forming a semiconductor layer coupled to the dielectric layer;
      forming a trench in the substrate, wherein the first active region is on a first side of the trench and the second active region is on a second side of the trench;
   filling the trench with an aerogel material; and
   curing the aerogel material.

12. The method of claim 11, wherein forming the dielectric layer includes forming a silicon dioxide (SiO2) layer.

13. The method of claim 11, wherein forming the dielectric layer includes forming an air gap.

14. The method of claim 11, wherein the method is performed in the order presented.

15. A method of isolating a first active region from a second active region in an integrated circuit device, comprising:
   forming a substrate, including:
      forming a dielectric layer, wherein forming the dielectric layer includes forming an air gap;
      forming a semiconductor layer coupled to the dielectric layer;
      forming a trench in the substrate, wherein the first active region is on a first side of the trench and the second active region is on a second side of the trench;
   filling the trench with a polymeric material;
   defining additional structures in the integrated circuit device; and
   removing the polymeric material.

16. The method of claim 15, wherein forming the dielectric layer includes forming a silicon dioxide (SiO2) layer.

17. The method of claim 15, wherein removing the polymeric material includes decomposing the polymeric material.

18. The method of claim 15, wherein removing the polymeric material includes exposing the polymeric material to an oxygen plasma.

19. The method of claim 15, wherein removing the polymeric material includes exposing the polymeric material to an ozone plasma.

20. The method of claim 15, wherein the method is performed in the order presented.

21. A method of isolating a first active region from a second active region in an integrated circuit device, comprising:
    forming a substrate, including:
        forming a dielectric layer, wherein forming the dielectric layer includes forming an air gap;
        forming a semiconductor layer coupled to the dielectric layer;
        forming a trench in the substrate, wherein the first active region is on a first side of the trench and the second active region is on a second side of the trench;
    filling the trench with a first fill material;
    defining additional structures in the integrated circuit device;
    removing the first fill material; and
    filling the trench with a second fill material.

22. The method of claim 21, wherein forming the dielectric layer includes forming a silicon dioxide (SiO2) layer.

23. The method of claim 21, wherein filling the trench with the first fill material includes filling the trench with a polymeric material.

24. The method of claim 23, wherein filling the trench with the polymeric material includes filling the trench with a polymeric material selected from the group consisting of methylsilsesquioxane materials, polyimide materials and polynorbornene materials.

25. The method of claim 21, wherein filling the trench with the second fill material includes filling the trench with a foamed polymeric material.

26. The method of claim 25, wherein filling the trench with the foamed polymeric material includes filling the trench with a cured aerogel.

27. The method of claim 21, wherein filling the trench with the second fill material includes filling the trench with an air gap.

28. The method of claim 21, wherein the method is performed in the order presented.

29. A method of isolating a first active region from a second active region in an integrated circuit device, comprising:
    forming a substrate, including:
        forming a dielectric layer;
        forming a semiconductor layer coupled to the dielectric layer;
        forming a trench in the substrate, wherein the first active region is on a first side of the trench and the second active region is on a second side of the trench;
    filling the trench with a first polymeric material;
    defining additional structures in the integrated circuit device;
    removing the first polymeric material;
    filling the trench with a second polymeric material; and
    foaming the second polymeric material.

30. The method of claim 29, wherein forming the dielectric layer includes forming a silicon dioxide (SiO2) layer.

31. The method of claim 29, wherein forming the dielectric layer includes forming an air gap.

32. The method of claim 29, wherein the method is performed in the order presented.

33. A method of isolating a first active region from a second active region in an integrated circuit device, comprising:
    forming a substrate, including:
        forming a dielectric layer;
        forming a semiconductor layer coupled to the dielectric layer;
        forming a trench in the substrate, wherein the first active region is on a first side of the trench and the second active region is on a second side of the trench;
    filling the trench with a polymeric material;
    defining additional structures in the integrated circuit device;
    removing the polymeric material;
    filling the trench with an aerogel material; and
    curing the aerogel material.

34. The method of claim 33, wherein forming the dielectric layer includes forming a silicon dioxide (SiO2) layer.

35. The method of claim 33, wherein forming the dielectric layer includes forming an air gap.

36. The method of claim 33, wherein the method is performed in the order presented.

* * * * *

UNITED STATES PATENT AND TRADEMARK OFFICE
CERTIFICATE OF CORRECTION

PATENT NO. : 6,677,209 B2
DATED : January 13, 2004
INVENTOR(S) : Farrar

It is certified that error appears in the above-identified patent and that said Letters Patent is hereby corrected as shown below:

<u>Title page,</u>
Item [56], References Cited, OTHER PUBLICATIONS, "Chiniwalla P., et al.," reference, delete "Eigth" and insert -- Eighth --, therefor.
"Volksen, W., et al.," reference, delete "Dialectricts" and insert -- Dielectrics --, therefor. (both occurrences)

<u>Column 1,</u>
Line 6, delete "U.S. Pat. No. 6,413,827" and insert -- U.S. Pat. No. 6,413,827 --, therefor.

<u>Column 8,</u>
Line 25, after "($O_2$)" insert -- , --.

<u>Column 9,</u>
Line 46, delete "FIG. 11" and insert -- FIG. 1I --, therefor.
Line 48, delete "In FIG. 1I, P-Type dopants" and, (as a new paragraph), insert -- In FIG. 1I, P-Type dopants -- before "have been used" on line 49

<u>Column 13,</u>
Line 62, delete "maybe" and insert -- may be --, therefor.

<u>Column 16,</u>
Lines 4 and 47, delete "SiO2" and insert -- $SiO_2$ --, therefor.

<u>Column 17,</u>
Lines 2 and 33, delete "SiO2" and insert -- $SiO_2$ --, therefor.

UNITED STATES PATENT AND TRADEMARK OFFICE
CERTIFICATE OF CORRECTION

PATENT NO. : 6,677,209 B2
DATED : January 13, 2004
INVENTOR(S) : Farrar

It is certified that error appears in the above-identified patent and that said Letters Patent is hereby corrected as shown below:

Column 18,
Lines 21 and 46, delete "SiO2" and insert -- $SiO_2$ --, therefor.

Signed and Sealed this

Twenty-second Day of June, 2004

JON W. DUDAS
*Acting Director of the United States Patent and Trademark Office*